(12) United States Patent
Kim et al.

(10) Patent No.: US 10,043,903 B2
(45) Date of Patent: Aug. 7, 2018

(54) SEMICONDUCTOR DEVICES WITH SOURCE/DRAIN STRESS LINER

(71) Applicant: Samsung Electronics Co., Ltd., Suwon-si, Gyeonggi-do (KR)

(72) Inventors: Ju Youn Kim, Suwon-si (KR); Gi Gwan Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/384,587

(22) Filed: Dec. 20, 2016

(65) Prior Publication Data

US 2017/0179284 A1 Jun. 22, 2017

Related U.S. Application Data

(60) Provisional application No. 62/270,363, filed on Dec. 21, 2015.

(51) Int. Cl.
| | |
|---|---|
| *H01L 21/02* | (2006.01) |
| *H01L 29/78* | (2006.01) |
| *H01L 27/092* | (2006.01) |
| *H01L 29/08* | (2006.01) |
| *H01L 21/8238* | (2006.01) |

(Continued)

(52) U.S. Cl.
CPC .. *H01L 29/7843* (2013.01); *H01L 21/823814* (2013.01); *H01L 21/823821* (2013.01); *H01L 21/823878* (2013.01); *H01L 27/0924* (2013.01); *H01L 29/0847* (2013.01); *H01L 29/66545* (2013.01); *H01L 29/7848* (2013.01); *H01L 29/165* (2013.01)

(58) Field of Classification Search
CPC ......... H01L 29/7843; H01L 21/823878; H01L 21/823821; H01L 29/0653; H01L 29/7848; H01L 21/823814; H01L 29/1608; H01L 29/161; H01L 29/0847; H01L 27/0924; H01L 29/165
See application file for complete search history.

(56) References Cited

U.S. PATENT DOCUMENTS

| | | |
|---|---|---|
| 5,953,600 A | 9/1999 | Gris |
| 7,060,549 B1 | 6/2006 | Craig et al. |
| 7,388,259 B2 | 6/2008 | Doris et al. |

(Continued)

OTHER PUBLICATIONS

US 8,664,074, 03/2014, Pidin (withdrawn)

*Primary Examiner* — Ismail Muse
(74) *Attorney, Agent, or Firm* — Ward and Smith, P.A.

(57) ABSTRACT

A semiconductor device includes a substrate including a first region and a second region, a first fin-type pattern in the first region, a second fin-type pattern in the second region, a first gate structure intersecting the first fin-type pattern, the first gate structure including a first gate spacer, a second gate structure intersecting the second fin-type pattern, the second gate structure including a second gate spacer, a first epitaxial pattern formed on opposite sides of the first gate structure, on the first fin-type pattern, the first epitaxial pattern having a first impurity, a second epitaxial pattern formed on opposite sides of the second gate structure, on the second fin-type pattern, the second epitaxial pattern having a second impurity, a first silicon nitride film extending along a sidewall of the first gate spacer, and a first silicon oxide film extending along a sidewall of the first gate spacer.

18 Claims, 28 Drawing Sheets

(51) Int. Cl.
*H01L 29/66* (2006.01)
*H01L 29/165* (2006.01)

(56) References Cited

U.S. PATENT DOCUMENTS

| | | | |
|---|---|---|---|
| 7,462,257 B2 | 12/2008 | Conti et al. |
| 7,462,527 B2 | 12/2008 | Conti et al. |
| 7,816,271 B2 | 10/2010 | Lee et al. |
| 7,935,589 B2 | 5/2011 | Teo et al. |
| 7,935,993 B2 | 5/2011 | Chen et al. |
| 7,943,504 B2 | 5/2011 | Hantschel et al. |
| 7,955,888 B2 | 6/2011 | Beak et al. |
| 7,955,952 B2 | 6/2011 | Liu et al. |
| 7,960,794 B2 | 6/2011 | Doyle et al. |
| 7,964,454 B2 | 6/2011 | Maeda et al. |
| 7,981,784 B2 | 7/2011 | Shin et al. |
| 7,994,059 B2 | 8/2011 | Richter et al. |
| 7,998,835 B2 | 8/2011 | Teo et al. |
| 7,999,325 B2 | 8/2011 | The et al. |
| 8,008,744 B2 | 8/2011 | Teo et al. |
| 8,013,327 B2 | 9/2011 | Liu et al. |
| 8,013,392 B2 | 9/2011 | Doris et al. |
| 8,026,573 B2 | 9/2011 | Kuo et al. |
| 8,034,724 B2 | 10/2011 | Shimomura et al. |
| 8,035,166 B2 | 10/2011 | Sadoughi |
| 8,043,706 B2 | 10/2011 | Goto et al. |
| 8,058,123 B2 | 11/2011 | Liu et al. |
| 8,058,733 B2 | 11/2011 | Yang |
| 8,067,291 B2 | 11/2011 | Shima |
| 8,071,493 B2 | 12/2011 | Yagi |
| 8,076,703 B2 | 12/2011 | Sultan et al. |
| 8,084,822 B2 | 12/2011 | Chatty et al. |
| 8,093,077 B2 | 1/2012 | Lahreche |
| 8,093,167 B2 | 1/2012 | Yagi et al. |
| 8,093,665 B2 | 1/2012 | Yang et al. |
| 8,097,167 B2 | 1/2012 | Moody et al. |
| 8,101,476 B2 | 1/2012 | Garg et al. |
| 8,101,480 B1 | 1/2012 | Kim et al. |
| 8,113,914 B2 | 2/2012 | Ohashi et al. |
| 8,114,795 B2 | 2/2012 | Yagi et al. |
| 8,119,267 B2 | 2/2012 | Osakabe et al. |
| 8,119,541 B2 | 2/2012 | Teo et al. |
| 8,129,235 B2 | 3/2012 | Chou et al. |
| 8,138,523 B2 | 3/2012 | Bedell et al. |
| 8,154,107 B2 | 4/2012 | Ke et al. |
| 8,158,474 B2 | 4/2012 | Hsiao et al. |
| 8,160,416 B2 | 4/2012 | Shiraishi |
| 8,168,295 B2 | 5/2012 | Murata |
| 8,183,105 B2 | 5/2012 | Sadoughi |
| 8,207,043 B2 | 6/2012 | Lin et al. |
| 8,210,903 B2 | 7/2012 | Ueda |
| 8,216,905 B2 | 7/2012 | Hsiao et al. |
| 8,218,353 B1 | 7/2012 | Liu et al. |
| 8,227,308 B2 | 7/2012 | Lim et al. |
| 8,227,869 B2 | 7/2012 | Lu et al. |
| 8,232,154 B2 | 7/2012 | Chien et al. |
| 8,242,027 B2 | 8/2012 | Suzuki |
| 8,247,261 B2 | 8/2012 | Bedell et al. |
| 8,250,926 B2 | 8/2012 | Yang et al. |
| 8,252,650 B1 | 8/2012 | Chang et al. |
| 8,253,081 B2 | 8/2012 | Dydo et al. |
| 8,253,193 B2 | 8/2012 | Denison et al. |
| 8,257,831 B2 | 9/2012 | Yagi |
| 8,274,115 B2 | 9/2012 | Teo et al. |
| 8,238,060 B2 | 10/2012 | Yagi et al. |
| 8,293,605 B2 | 10/2012 | Baars et al. |
| 8,298,876 B2 | 10/2012 | Balch et al. |
| 8,306,626 B2 | 11/2012 | Chow et al. |
| 8,327,666 B2 | 12/2012 | Harvey et al. |
| 8,334,567 B2 | 12/2012 | Chu et al. |
| 8,341,976 B2 | 1/2013 | Dejneka et al. |
| 8,344,431 B2 | 1/2013 | Beak et al. |
| 8,349,454 B2 | 1/2013 | Murata et al. |
| 8,349,455 B2 | 1/2013 | Kondo et al. |
| 8,361,851 B2 | 1/2013 | Zhu et al. |
| 8,434,780 B2 | 1/2013 | Barbe et al. |
| 8,395,222 B2 | 3/2013 | Pidin |
| 8,399,933 B2 | 3/2013 | Bedell et al. |
| 8,405,143 B2 | 3/2013 | Lin et al. |
| 8,435,849 B2 | 5/2013 | Wang et al. |
| 8,445,978 B2 | 5/2013 | Perruchot et al. |
| 8,450,184 B2 | 5/2013 | Bedell et al. |
| 8,470,674 B2 | 6/2013 | Anderson et al. |
| 8,497,197 B2 | 7/2013 | Zhu et al. |
| 8,502,286 B2 | 8/2013 | Lim et al. |
| 8,506,822 B2 | 8/2013 | Moody et al. |
| 8,512,818 B1 | 8/2013 | Varadarajan et al. |
| 8,518,545 B2 | 8/2013 | Akiba et al. |
| 8,519,454 B2 | 8/2013 | Guo et al. |
| 8,502,289 B2 | 9/2013 | Wang et al. |
| 8,546,860 B2 | 10/2013 | Hsiao et al. |
| 8,546,873 B2 | 10/2013 | Liu et al. |
| 8,558,278 B2 | 10/2013 | Chuang et al. |
| 8,564,063 B2 | 10/2013 | Fu et al. |
| 8,574,957 B2 | 11/2013 | Mikawa et al. |
| 8,586,423 B2 | 11/2013 | Camillo-Castillo et al. |
| 8,598,660 B2 | 12/2013 | Camillo-Castillo et al. |
| 8,598,771 B2 | 12/2013 | Carlson et al. |
| 8,604,693 B2 | 12/2013 | Ono et al. |
| 8,617,652 B2 | 12/2013 | Lee |
| 8,642,175 B2 | 2/2014 | Hashimoto et al. |
| 8,652,979 B2 | 2/2014 | Murata |
| 8,664,058 B2 | 3/2014 | Bedell et al. |
| 8,664,119 B2 | 3/2014 | Yin et al. |
| 8,669,619 B2 | 3/2014 | Chang et al. |
| 8,673,722 B2 | 3/2014 | Huang et al. |
| 8,673,757 B2 | 3/2014 | Henson |
| 8,679,631 B2 | 3/2014 | Murata |
| 8,690,065 B2 | 4/2014 | Pelgrom et al. |
| 8,691,644 B2 | 4/2014 | Song et al. |
| 8,692,332 B2 | 4/2014 | Chen et al. |
| 8,703,073 B2 | 4/2014 | Gracias et al. |
| 8,703,569 B2 | 4/2014 | Pidin |
| 8,704,280 B2 | 4/2014 | Xu |
| 8,704,294 B2 | 4/2014 | Liao et al. |
| 8,715,829 B2 | 5/2014 | Akjiba et al. |
| 8,728,638 B2 | 5/2014 | Isono et al. |
| 8,733,129 B2 | 5/2014 | Eda et al. |
| 8,735,239 B2 | 5/2014 | Park et al. |
| 8,736,016 B2 | 5/2014 | Liang et al. |
| 8,748,002 B2 | 6/2014 | Murata |
| 8,753,744 B2 | 6/2014 | Borrelli et al. |
| 8,753,994 B2 | 6/2014 | Danielson et al. |
| 8,754,482 B2 | 6/2014 | Yin et al. |
| 8,722,120 B2 | 7/2014 | Chang et al. |
| 8,722,173 B2 | 7/2014 | Yu et al. |
| 8,765,561 B2 | 7/2014 | Hung et al. |
| 8,765,591 B2 | 7/2014 | Fu et al. |
| 8,783,063 B2 | 7/2014 | Osakabe et al. |
| 8,785,010 B2 | 7/2014 | Eda et al. |
| 8,787,980 B2 | 7/2014 | Hashimoto et al. |
| 8,790,972 B2 | 7/2014 | Jeong et al. |
| 8,791,502 B2 | 7/2014 | Wang |
| 8,807,711 B2 | 8/2014 | Shklyarevskiy et al. |
| 8,813,520 B2 | 8/2014 | Hashimoto et al. |
| 8,815,420 B2 | 8/2014 | Krasnov et al. |
| 8,828,545 B2 | 9/2014 | Sun et al. |
| 8,828,815 B2 | 9/2014 | Chou et al. |
| 8,835,007 B2 | 9/2014 | Murata et al. |
| 8,835,243 B2 | 9/2014 | Tsai et al. |
| 8,835,291 B2 | 9/2014 | Huang et al. |
| 8,840,997 B2 | 9/2014 | Koyama et al. |
| 8,841,193 B2 | 9/2014 | Guo et al. |
| 8,852,721 B2 | 10/2014 | Hung et al. |
| 8,852,764 B2 | 10/2014 | Yagi et al. |
| 8,853,023 B2 | 10/2014 | Morvan et al. |
| 8,859,358 B2 | 10/2014 | Wang et al. |
| 8,869,558 B2 | 10/2014 | Yamamoto et al. |
| 8,871,587 B2 | 10/2014 | McMullan et al. |
| 8,878,280 B2 | 11/2014 | Zhu et al. |
| 8,882,529 B2 | 11/2014 | Weber et al. |
| 8,885,447 B2 | 11/2014 | Matsumoto et al. |
| 8,889,478 B2 | 11/2014 | Mikawa et al. |
| 8,901,662 B2 | 12/2014 | Zhu et al. |

(56) References Cited

U.S. PATENT DOCUMENTS

| | | | |
|---|---|---|---|
| 8,906,506 B2 | 12/2014 | Shibata et al. | |
| 8,912,020 B2 | 12/2014 | Bedell et al. | |
| 8,921,944 B2 | 12/2014 | Wu et al. | |
| 8,925,389 B2 | 1/2015 | Akiba et al. | |
| 8,932,901 B2 | 1/2015 | Cheng | |
| 8,936,988 B2 | 1/2015 | Yiu et al. | |
| 8,937,369 B2 | 1/2015 | Liu et al. | |
| 8,946,721 B2 | 2/2015 | Henson | |
| 8,946,799 B2 | 2/2015 | Camillo-Castillo et al. | |
| 8,952,451 B2 | 2/2015 | Liao et al. | |
| 8,961,144 B2 | 2/2015 | Ganesh et al. | |
| 8,962,419 B2 | 2/2015 | McMullan et al. | |
| 8,963,205 B2 | 2/2015 | Kim et al. | |
| 8,975,186 B2 | 3/2015 | Zhang et al. | |
| 8,978,414 B2 | 3/2015 | Bookbinder et al. | |
| 8,980,777 B2 | 3/2015 | Danielson et al. | |
| 8,981,379 B2 | 3/2015 | Shimomura et al. | |
| 8,999,863 B2 | 4/2015 | Lee et al. | |
| 9,006,052 B2 | 4/2015 | Holt et al. | |
| 9,006,058 B1 | 4/2015 | Chen et al. | |
| 9,012,343 B2 | 4/2015 | Yamamoto et al. | |
| 9,018,712 B2 | 4/2015 | He | |
| 9,034,102 B2 | 5/2015 | Huang et al. | |
| 9,034,469 B2 | 5/2015 | Murata | |
| 9,034,712 B2 | 5/2015 | Camillo-Castillo et al. | |
| 9,040,147 B2 | 5/2015 | Hashimoto et al. | |
| 9,045,364 B2 | 6/2015 | Sharma et al. | |
| 9,054,250 B2 | 6/2015 | Murata | |
| 9,073,291 B2 | 7/2015 | Bookbinder et al. | |
| 9,073,746 B2 | 7/2015 | Liu | |
| 9,080,233 B2 | 7/2015 | Suzuki et al. | |
| 9,082,875 B2 | 7/2015 | Balch et al. | |
| 9,085,486 B2 | 7/2015 | Eda et al. | |
| 9,093,361 B2 | 7/2015 | Hino et al. | |
| 9,096,463 B2 | 8/2015 | Hashimoto et al. | |
| 9,099,336 B2 | 8/2015 | Ha et al. | |
| 9,102,566 B2 | 8/2015 | Sawada | |
| 9,105,471 B2 | 8/2015 | Clark et al. | |
| 9,108,314 B2 | 8/2015 | Gracias et al. | |
| 9,117,438 B2 | 8/2015 | Dirksen et al. | |
| 9,125,243 B2 | 9/2015 | Dydo et al. | |
| 9,148,712 B2 | 9/2015 | Dehe | |
| 9,153,269 B2 | 10/2015 | Isono et al. | |
| 9,154,138 B2 | 10/2015 | Limb et al. | |
| 9,156,721 B2 | 10/2015 | Dai et al. | |
| 9,165,788 B2 | 10/2015 | Fox et al. | |
| 9,165,941 B2 | 10/2015 | Yang et al. | |
| 9,166,050 B2 | 10/2015 | Zhou | |
| 9,166,191 B2 | 10/2015 | Yoon | |
| 9,171,807 B2 | 10/2015 | Takada | |
| 9,177,801 B2 | 11/2015 | Lee et al. | |
| 9,184,051 B2 | 11/2015 | Stauss et al. | |
| 9,184,134 B2 | 11/2015 | Lin et al. | |
| 9,199,876 B2 | 12/2015 | Wang et al. | |
| 9,502,538 B2 * | 11/2016 | Jangjian | H01L 29/66795 |
| 2006/0006420 A1 | 1/2006 | Goto | |
| 2009/0302401 A1 * | 12/2009 | Teo | H01L 21/823807 257/410 |
| 2009/0321840 A1 * | 12/2009 | Pidin | H01L 21/3185 257/369 |
| 2010/0297818 A1 * | 11/2010 | Han | H01L 21/823807 438/230 |
| 2011/0223736 A1 * | 9/2011 | Lin | H01L 21/823821 438/305 |
| 2011/0266636 A1 * | 11/2011 | Rong | H01L 29/4983 257/408 |
| 2012/0007188 A1 * | 1/2012 | Sadoughi | H01L 21/823807 257/369 |
| 2012/0190162 A1 * | 7/2012 | Miyashita | H01L 21/26506 438/299 |
| 2012/0241868 A1 * | 9/2012 | Tsai | H01L 21/823807 257/369 |
| 2013/0241004 A1 * | 9/2013 | Yin | H01L 21/823807 257/392 |
| 2013/0252387 A1 * | 9/2013 | Tsai | H01L 21/823807 438/231 |
| 2014/0248761 A1 * | 9/2014 | Park | H01L 21/823871 438/586 |
| 2015/0162333 A1 * | 6/2015 | Kuo | H01L 29/785 257/401 |
| 2015/0228788 A1 * | 8/2015 | Chen | H01L 29/7847 257/288 |
| 2015/0380519 A1 * | 12/2015 | Zhao | H01L 21/02164 257/410 |
| 2017/0162573 A1 * | 6/2017 | Tsai | H01L 21/266 |
| 2017/0162575 A1 * | 6/2017 | Li | H01L 21/28088 |
| 2017/0221906 A1 * | 8/2017 | Lin | H01L 27/1104 257/392 |

* cited by examiner

SEMICONDUCTOR DEVICES WITH SOURCE/DRAIN STRESS LINER

CROSS-REFERENCE TO RELATED APPLICATIONS

This application claims priority from Korean Patent Application No. 10-2016-0015592 filed on Feb. 11, 2016 in the Korean Intellectual Property Office, and all the benefits accruing therefrom under 35 U.S.C. 119, and also claims priority from U.S. Provisional Patent Application No. 62/270,363, filed Dec. 21, 2015, and all the benefits accruing therefrom under 35 U.S.C. 119, the contents of each of which in their entirety are herein incorporated by reference.

BACKGROUND

The present disclosure relates to semiconductor devices and methods for fabricating the same.

For semiconductor device density enhancement, the multigate transistor has been suggested as one of the scaling technologies, according to which a multi-channel active pattern (or silicon body) in a fin or nanowire shape is formed on a substrate, with gates then being formed on a surface of the multi-channel active pattern.

This multigate transistor allows easy scaling, as it uses a three-dimensional channel. Further, current control capability can be enhanced without requiring increased gate length of the multigate transistor. Furthermore, it is possible to effectively suppress short channel effect (SCE) which is the phenomenon in which the electric potential of the channel region is influenced by the drain voltage.

SUMMARY

An object of the present disclosure is to provide semiconductor devices capable of improving operation performance and reliability, by applying a stress liner to a source/drain region.

Another technical object of the present disclosure is to provide methods for fabricating a semiconductor device capable of improving operation performance and reliability, by applying a stress liner to a source/drain region.

The objects according to the present disclosure are not limited to those set forth above and objects other than those set forth above will be clearly understood to a person skilled in the art from the following description.

According to an aspect of the present inventive concepts, there is provided a semiconductor device comprising a substrate including a first region and a second region; a first fin-type pattern on the substrate in the first region; a second fin-type pattern on the substrate in the second region; a first gate structure intersecting the first fin-type pattern on the first fin-type pattern, the first gate structure including a first gate spacer; a second gate structure intersecting the second fin-type pattern on the second fin-type pattern, the second gate structure including a second gate spacer; a first epitaxial pattern formed on opposite sides of the first gate structure, on the first fin-type pattern, the first epitaxial pattern having a first impurity; a second epitaxial pattern formed on opposite sides of the second gate structure, on the second fin-type pattern, the second epitaxial pattern having a second impurity; a first silicon nitride film extending along a sidewall of the first gate spacer, a sidewall of the second gate spacer, an upper surface of the first epitaxial pattern, and an upper surface of the second epitaxial pattern; and a first silicon oxide film extending along a sidewall of the first gate spacer between the first gate spacer and the first silicon nitride film.

According to another aspect of the present inventive concepts, there is provided a semiconductor device comprising a first fin-type pattern and a second fin-type pattern being in parallel in a lengthwise direction, on a substrate; a field insulating film between the first fin-type pattern and the second fin-type pattern, on the substrate; a first gate structure intersecting the first fin-type pattern on the first fin-type pattern, the first gate structure including a first gate spacer; a second gate structure intersecting the second fin-type pattern on the second fin-type pattern, the second gate structure including a second gate spacer; a first epitaxial pattern formed on opposite sides of the first gate structure, on the first fin-type pattern, the first epitaxial pattern having a p-type impurity; a second epitaxial pattern formed on opposite sides of the second gate structure, on the second fin-type pattern, the second epitaxial pattern having an n-type impurity; a first silicon nitride film extending along a sidewall of the first gate spacer, a sidewall of the second gate spacer, an upper surface of the first epitaxial pattern, an upper surface of the second epitaxial pattern, and an upper surface of the field insulating film; and a first silicon oxide film extending along a sidewall of the first gate spacer and the upper surface of the field insulating film between the first gate spacer and the first silicon nitride film.

In some embodiments of the present inventive concepts, the first silicon oxide film and the second silicon oxide film are directly connected to each other on the field insulating film.

According to another aspect of the present inventive concepts, there is provided a semiconductor device that includes a first fin-type pattern in a first region of a substrate, a second fin-type pattern in a second region of the substrate, a first gate structure on the first fin-type pattern and including a first gate spacer, a second gate structure on the second fin-type pattern and including a second gate spacer, a first epitaxial pattern formed on opposite sides of the first gate structure and having a first impurity, a second epitaxial pattern formed on opposite sides of the second gate structure and having a second impurity, a first silicon nitride film extending along a sidewall of the first gate spacer, and a first silicon oxide film extending along a portion of the sidewall of the first gate spacer.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Figure 1:
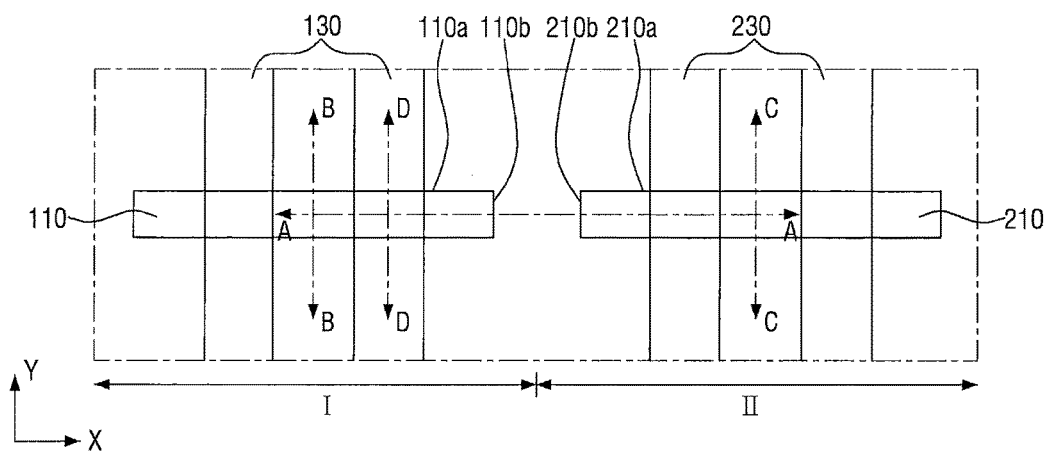
FIG. 1 is a layout diagram provided to explain a semiconductor device according to some example embodiments.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concepts will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which these inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Although the drawings regarding a semiconductor device according to some example embodiments exemplify a fin-type transistor (FinFET) comprising a channel region in a fin-type pattern shape, example embodiments are not limited thereto. It is of course possible that a semiconductor device according to some example embodiments may include a tunneling FET, a transistor comprising nanowire, a transistor comprising nano-sheet, or a three-dimensional (3D) transistor. Further, a semiconductor device according to some example embodiments may include a bipolar junction transistor, a laterally diffused metal oxide semiconductor (LDMOS) transistor, and so on.

Hereinbelow, a semiconductor device according to some example embodiments will be explained with reference to FIGS. 1 to 4C.

Figure 2A:
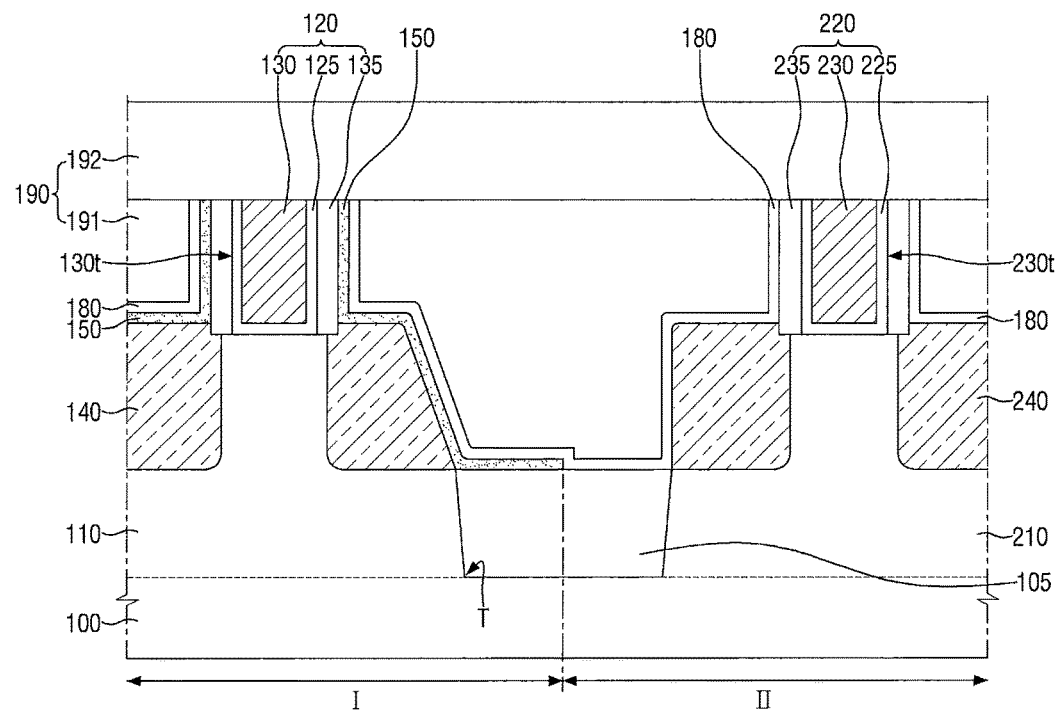
FIGS. 2A and 2B are cross sectional views taken on line A-A of FIG. 1.
Figure 2B:
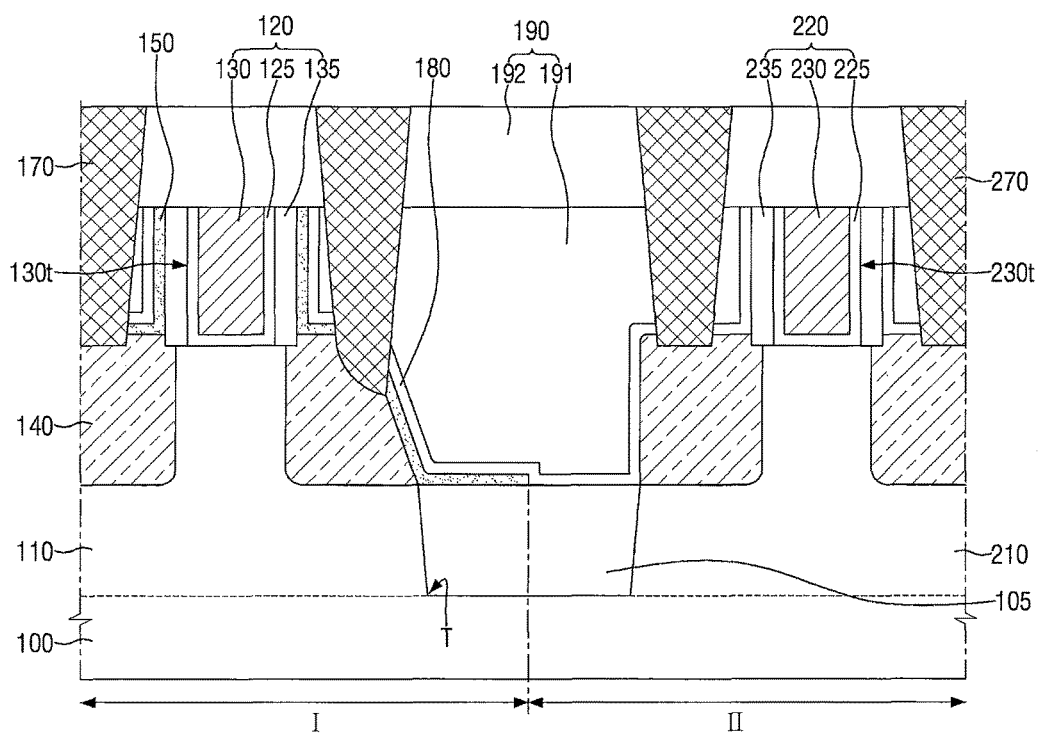
Figure 3A:
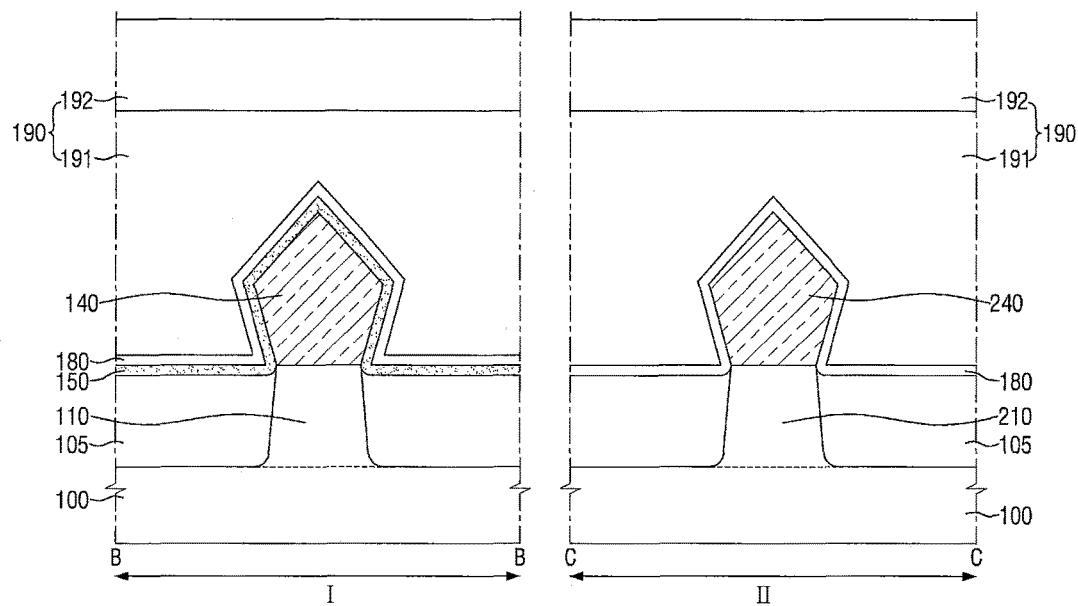
FIGS. 3A and 3B are cross sectional views taken on lines B-B and C-C of FIG. 1.
Figure 3B:
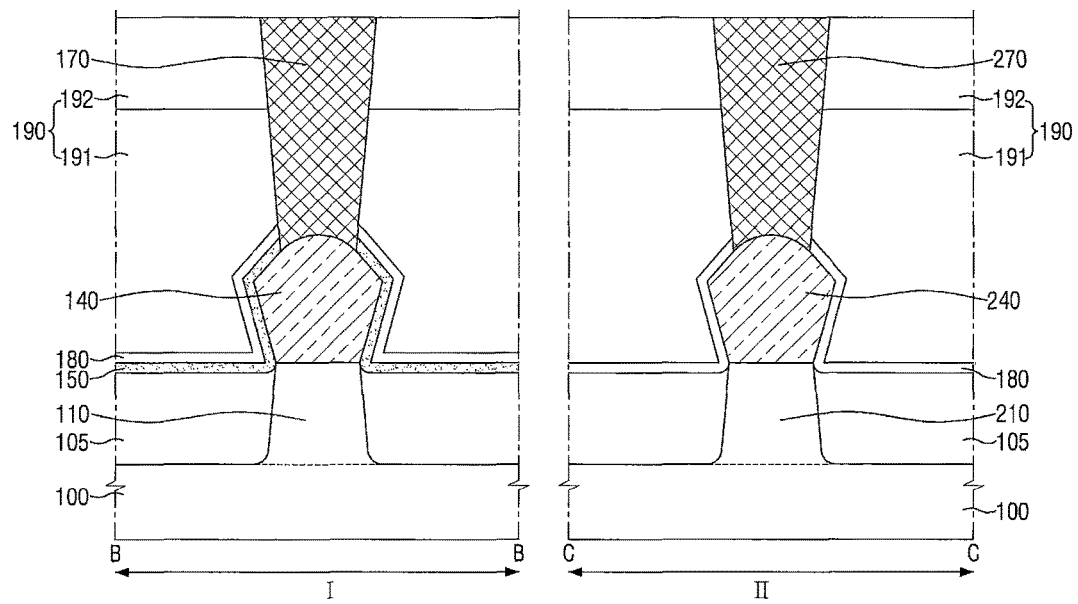
Figure 4A:
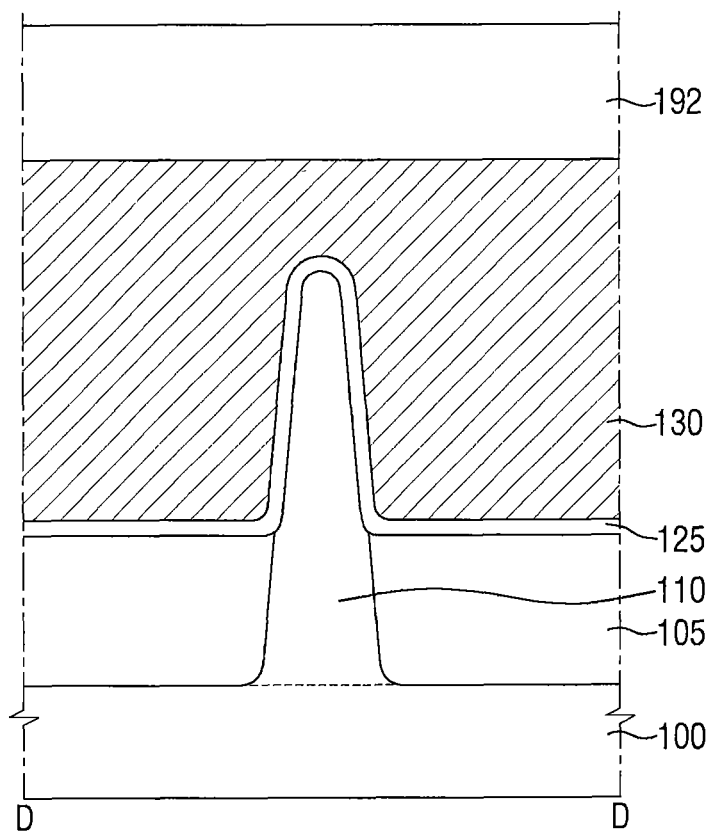
FIGS. 4A to 4C are various examples of a cross sectional view taken on line D-D of FIG. 1.
Figure 4B:
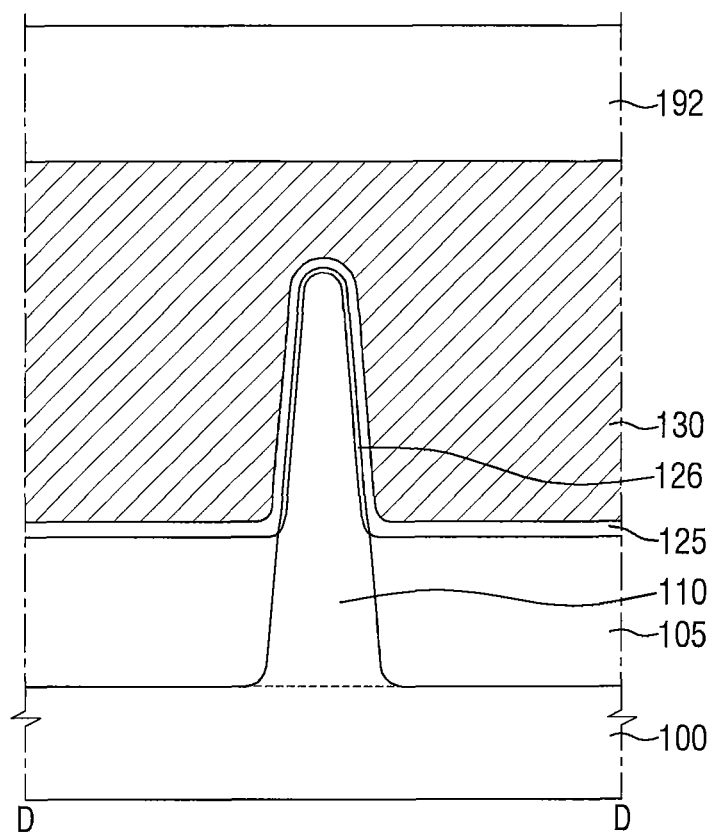
Figure 4C:
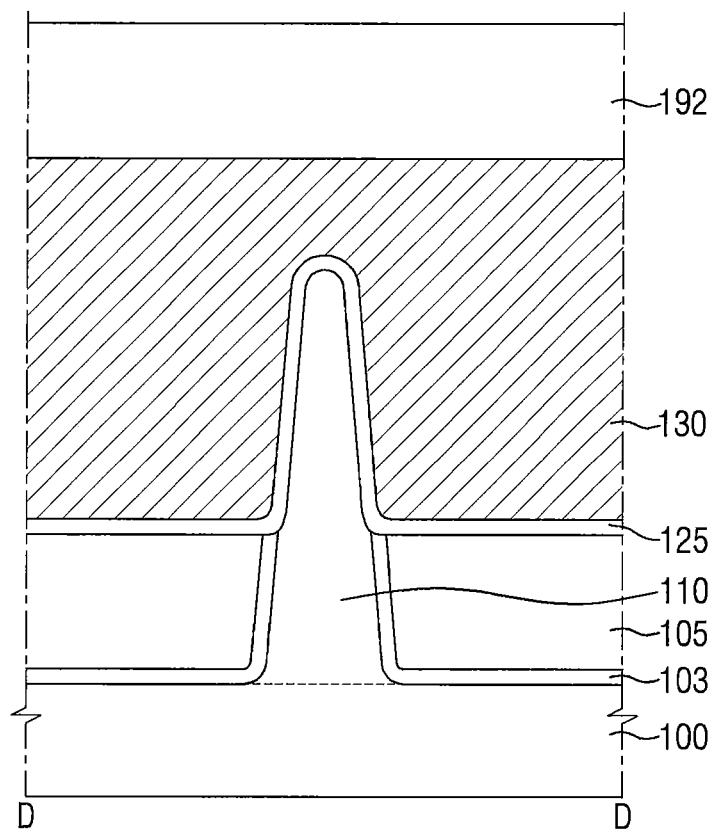

FIG. 1 is a layout diagram provided to explain a semiconductor device according to some example embodiments. FIGS. 2A and 2B are cross sectional views taken on line A-A of FIG. 1. FIGS. 3A and 3B are cross sectional views taken on lines B-B and C-C of FIG. 1. FIGS. 4A to 4C are various examples of a cross sectional view taken on line D-D of FIG. 1.

For reference, FIG. 2B is an example view illustrating a case in which a contact is formed on the source/drain region of FIG. 2A. FIG. 3B is an example view illustrating a case in which a contact is formed on the source/drain region of FIG. 3A.

Referring to FIGS. 1 to 4C, the semiconductor device according to some example embodiments may include a first fin-type pattern 110, a second fin-type pattern 210, a first gate structure 120, a second gate structure 220, a first epitaxial pattern 140, a second epitaxial pattern 240, a first stress liner 150, and an upper liner 180.

The substrate 100 may include a first region I and a second region II. The first region I and the second region II may be the regions that are spaced apart from each other, or connected to each other.

To easily explain a positional relationship of the upper liner 180 and the first stress liner 150 between the first region I and the second region II, FIGS. 1 to 2B illustrate the first region I and the second region II being connected to each other, but example embodiments are not limited thereto.

Further, the transistor formed in the first region I and the transistor formed in the second region II may be of a same type, or different types from each other.

Hereinbelow, it will be explained herein that the first region I is a PMOS formation region, and the second region II is an NMOS formation region.

The substrate 100 may be a bulk silicon or a silicon-on-insulator (SOI). In some embodiments, the substrate 100 may be a silicon substrate, or may include other material such as, for example, silicon germanium, silicon germanium on insulator (SGOI), indium antimonide, lead telluride compound, indium arsenide, indium phosphide, gallium arsenide, and/or gallium antimonide, but not limited thereto.

The first fin-type pattern 110 may be formed on the substrate 100 in the first region I. For example, the first fin-type pattern 110 may protrude from the substrate 100.

The second fin-type pattern 210 may be formed on the substrate 100 in the second region II. For example, the second fin-type pattern 210 may protrude from the substrate 100.

The first fin-type pattern 110 and the second fin-type pattern 210 may be elongated in a first direction X, respectively. The first fin-type pattern 110 and the second fin-type pattern 210 may be formed in parallel in a lengthwise direction.

Because the first fin-type pattern 110 and the second fin-type pattern 210 may be elongated in the first direction X, respectively, the first fin-type pattern 110 and the second fin-type pattern 210 may each include long sides 110a and 210a formed along the first direction X, and short sides 110b and 210b formed along a second direction Y.

That is, when the first fin-type pattern 110 and the second fin-type pattern 210 are formed in parallel in the lengthwise direction, it means that the short side 110b of the first fin-type pattern 110 is facing to the short side 210b of the second fin-type pattern 210.

A person skilled in the art will be obviously able to distinguish the long sides and the short sides even when the first fin-type pattern 110 and the second fin-type pattern 210 have rounded corners.

The first fin-type pattern 110 used as a channel region of the PMOS may be formed adjacent the second fin-type pattern 210 used a channel region of the NMOS.

The first fin-type pattern 110 and the second fin-type pattern 210 formed in parallel in the lengthwise direction may be isolated by an isolating trench T. The isolating trench T may be formed between the first fin-type pattern 110 and the second fin-type pattern 210.

More specifically, the isolating trench T may be formed so as to be in contact with the short side 110b of the first fin-type pattern 110 and the short side 210b of the second fin-type pattern 210. That is, the short side 110b of the first fin-type pattern 110 and the short side 210b of the second fin-type pattern 210 may be defined by at least a portion of the isolating trench T.

The first fin-type pattern 110 and the second fin-type pattern 210 refer to active patterns for use in the multigate transistor. That is, the first fin-type pattern 110 and the second fin-type pattern 210 may be formed as the channels are connected to each other along three surfaces of the fin-type pattern, or alternatively, the channels may be formed on two facing surfaces of the fin-type pattern.

The first fin-type pattern 110 and the second fin-type pattern 210 may be a portion of the substrate 100, and may include an epitaxial layer grown on the substrate 100.

The first fin-type pattern 110 and the second fin-type pattern 210 may include an element semiconductor material such as silicon or germanium, for example. Further, the first fin-type pattern 110 and the second fin-type pattern 210 may include a compound semiconductor such as, for example, IV-IV group compound semiconductor or III-V group compound semiconductor.

Specifically, take the IV-IV group compound semiconductor as an example, the first fin-type pattern 110 and the second fin-type pattern 210 may be a binary compound or a ternary compound including at least two or more of carbon (C), silicon (Si), germanium (Ge) and/or tin (Sn), or these compounds doped with IV group element.

Take the III-V group compound semiconductor for instance, the first fin-type pattern 110 and the second fin-type pattern 210 may be one of a binary compound, a ternary compound or a quaternary compound which is formed by a combination of a III group element which may be at least one of aluminum (Al), gallium (Ga), and indium (In), with a V group element which may be one of phosphorus (P), arsenic (As) and/or antimony (Sb).

When the first fin-type pattern 110 is used as the channel region of the PMOS and the second fin-type pattern 210 is used as the channel region of the NMOS, the first fin-type pattern 110 and the second fin-type pattern 210 may include different materials from each other.

For convenience of explanation, in the semiconductor device according to example embodiments, it is assumed that the first fin-type pattern 110 and the second fin-type pattern 210 are silicon fin-type patterns.

A field insulating film 105 may be formed on the substrate 100. The field insulating film 105 may be formed around the first fin-type pattern 110 and the second fin-type pattern 210. The first fin-type pattern 110 and the second fin-type pattern 210 may be defined by the field insulating film 105.

In other words, the field insulating film 105 may be formed on a portion of a sidewall of the first fin-type pattern 110 and on a portion of a sidewall of the second fin-type pattern 210. The portion of the first fin-type pattern 110 and the portion of the second fin-type pattern 210 may protrude upward higher than an upper surface of the field insulating film 105.

The field insulating film 105 may be formed between the first fin-type pattern 110 and the second fin-type pattern 210. For example, an upper surface of the field insulating film 105 located between the short side 110b of the first fin-type pattern and the short side 210b of the second fin-type pattern may be closer to the substrate 100 than to the upper surface of the first fin-type pattern 110 and the upper surface of the second fin-type pattern 210.

As illustrated in FIGS. 1 to 2B, no conductive patterns may intersect the first fin-type pattern 110 or the second fin-type pattern 210 on the field insulating film 105, but this is provided only for convenience of explanation and the example embodiments are not limited thereto.

The field insulating film 105 may include, for example, oxide film, nitride film, oxynitride film, and/or a film combining the above.

Unlike FIG. 4A, in FIG. 4C, a field liner 103 may be additionally formed between the field insulating film 105 and the first fin-type pattern 110, and between the field insulating film 105 and the substrate 100.

The field liner 103 may be formed along the sidewall of the first fin-type pattern 110 surrounded by the field insulating film 105, and along the upper surface of the substrate 100. The field liner 103 may not protrude upward higher than the upper surface of the field insulating film 105.

The field liner 103 may include at least one of, for example, polysilicon, amorphous silicon, silicon oxynitride, silicon nitride, and/or silicon oxide.

In some embodiments, the field liner 103 may be a double film including one of polysilicon or amorphous silicon, and silicon oxide.

As illustrated FIGS. 1 to 2B, the first region I and the second region II may be distinguished at the field insulating film 105 equidistant from the first fin-type pattern 110 and the second fin-type pattern 210, although example embodiments are not limited thereto.

That is, since the manner in which the first region I is distinguished from the second region II is presented herein only for notion and for explanation, a boundary between the first region I and the second region II may instead lean to the first fin-type pattern 110 or the second fin-type pattern 210.

The first gate structure 120 may be formed on the substrate 100 in the first region I, while extending in the second direction Y. The first gate structure 120 may be formed on the first fin-type pattern 110, while intersecting the first fin-type pattern 110.

The first gate structure 120 may include a first gate electrode 130, a first gate insulating film 125, and a first gate spacer 135.

The second gate structure 220 may be formed on the substrate 100 in the second region II, while extending in the second direction Y. The second gate structure 220 may be formed on the second fin-type pattern 210, while intersecting the second fin-type pattern 210.

The second gate structure 220 may include a second gate electrode 230, a second gate insulating film 225, and a second gate spacer 235.

A first gate spacer 135 may extend in the second direction Y and intersect the first fin-type pattern 110. The first gate spacer 135 may define a first trench 130t.

The first trench 130t may extend in the second direction Y and intersect the first fin-type pattern 110. The first trench 130t may expose a portion of the first fin-type pattern 110.

A second gate spacer 235 may extend in the second direction Y and intersect the second fin-type pattern 210. The second gate spacer 235 may define a second trench 230t.

The first trench 130t may extend in the second direction Y and intersect the first fin-type pattern 110. The first trench 130t may expose a portion of the first fin-type pattern 110.

The first gate spacer 135 and the second gate spacer 235 may each include at least one of, for example, silicon nitride (SiN), silicon oxynitride (SiON), silicon dioxide (SiO$_2$), silicon oxycarbonitride (SiOCN), and/or a combination thereof.

As illustrated, the first gate spacer 135 and the second gate spacer 235 may each be a single film. However, this is provided only for convenience of illustration and example embodiments are not limited thereto. When the first gate spacer 135 and the second gate spacer 235 are a plurality of films, at least one film of the first gate spacer 135 and the second gate spacer 235 may include a low-k dielectric material such as silicon oxycarbonitride (SiOCN).

Further, when the first gate spacer 135 and the second gate spacer 235 are a plurality of films, at least one film of the first gate spacer 135 and the second gate spacer 235 may have L-shape.

Depending on examples, the first gate spacer 135 and the second gate spacer 235 may serve as the guides to form self aligned contacts. Accordingly, the first gate spacer 135 and the second gate spacer 235 may include a material having etch selectivity to an interlayer insulating film 190 which will be described below.

The first gate insulating film 125 may be formed on the first fin-type pattern 110 and the field insulating film 105. The first gate insulating film 125 may be formed along a sidewall and a bottom surface of the first trench 130t.

The first gate insulating film 125 may be formed along a profile of the first fin-type pattern 110 protruding upward higher than the field insulating film 105, along the upper surface of the field insulating film 105, and along an inner sidewall of the first gate spacer 135.

Further, an interfacial layer 126 may be additionally formed between the first gate insulating film 125 and the first fin-type pattern 110. Although not illustrated, referring to FIGS. 2A and 2B, the interfacial layer may also be additionally formed between the first gate insulating film 125 and the first fin-type pattern 110.

Unlike FIG. 4A, as illustrated in FIG. 4B, the interfacial layer 126 may be formed along the profile of the first fin-type pattern 110 protruding higher than the upper surface of the field insulating film 105, although example embodiments are not limited thereto.

The interfacial layer 126 may extend along the upper surface of the field insulating film 105 according to a method used for forming the interfacial layer 126.

Hereinbelow, example embodiments are explained by referring to drawings in which illustration of the interfacial layer 126 is omitted for convenience of explanation.

The second gate insulating film 225 may be formed on the second fin-type pattern 210 and the field insulating film 105. The second gate insulating film 225 may be formed along a sidewall and a bottom surface of the second trench 230t.

Since description of the second gate insulating film 225 may be substantially similar to that of the first gate insulating film 125, it will not be redundantly described below.

The first gate insulating film 125 and the second gate insulating film 225 may each include, for example, at least one of silicon oxide, silicon oxynitride, silicon nitride, and/or a high-k dielectric material with a higher dielectric constant than silicon oxide.

For example, the high-k dielectric material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

Further, while the high-k dielectric material described above is explained mainly with reference to oxides, alternatively, the high-k dielectric material may include one or more of the nitride (e.g., hafnium nitride) or the oxynitride (e.g., hafnium oxynitride) of the metal materials (e.g., hafnium) described above, but not limited thereto.

The first gate electrode 130 may be formed on the first gate insulating film 125. The first gate electrode 130 may fill the first trench 130t.

The first gate electrode 130 may intersect the first fin-type pattern 110. The first gate electrode 130 may surround the first fin-type pattern 110 protruding upward higher than the field insulating film 105.

The second gate electrode 230 may be formed on the second gate insulating film 225. The second gate electrode 230 may fill the second trench 230t.

The second gate electrode 230 may intersect the second fin-type pattern 210. The second gate electrode 230 may surround the second fin-type pattern 210 protruding upward higher than the field insulating film 105.

As illustrated, the first gate electrode 130 and the second gate electrode 230 may be single films. However, this is provided only for convenience of illustration and example embodiments are not limited thereto. That is, it is of course possible that the first gate electrode 130 and the second gate electrode 230 may each include a plurality of films such as a barrier film, a work function adjustment film, a filling film, and so on.

The first gate electrode 130 and the second gate electrode 230 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantlum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and/or a combination thereof.

The first gate electrode 130 and the second gate electrode 230 may each include a conductive metal oxide, a conductive metal oxynitride, and so on, and an oxidized form of the materials described above.

A first epitaxial pattern 140 may be formed on opposite sides of the first gate structure 120. The first epitaxial pattern 140 may be formed on the first fin-type pattern 110. The first epitaxial pattern 140 may be included in the source/drain region, for example.

The first epitaxial pattern 140 may include a first impurity. Since the first epitaxial pattern 140 may be included in the source/drain region of the PMOS, the first epitaxial pattern 140 may include a p-type impurity.

The first epitaxial pattern 140 may include, for example, a compressive stress material. The compressive stress material may be a material that has a larger lattice constant than Si. The first epitaxial pattern 140 may include, for example, a silicon germanium (SiGe).

The compressive stress material can enhance carrier mobility in the channel region by exerting compressive stress on the first fin-type pattern 110.

A second epitaxial pattern 240 may be formed on opposite sides of the second gate structure 220. The second epitaxial pattern 240 may be formed on the second fin-type pattern 210. The second epitaxial pattern 240 may be included in the source/drain region, for example.

The second epitaxial pattern 240 may include a second impurity. Because the second epitaxial pattern 240 may be included in the source/drain region of the NMOS, the second epitaxial pattern 240 may include an n-type impurity.

The second epitaxial pattern 240 may include, for example, a tensile stress material. When the second fin-type pattern 210 is silicon, the second epitaxial pattern 240 may include a material such as SiC that has a smaller lattice constant than the silicon. For example, the tensile stress material can enhance carrier mobility in the channel region by exerting tensile stress on the second fin-type pattern 210.

However, the second fin-type pattern 240 may include a material same as the second fin-type pattern 210, that is, silicon.

As illustrated in FIG. 3A, the first epitaxial pattern 140 and the second epitaxial pattern 240 may each have a pentagon shape or a pentagon-like shape, but this is only for illustrative purpose, and embodiments are not limited thereto.

Further, in FIG. 2A illustrating a cross section taken along a lengthwise direction of the first fin-type pattern 110 and the second fin-type pattern 210, the first epitaxial pattern 140 formed in an end of the first fin-type pattern 110 may include a facet. However, the second epitaxial pattern 240 formed in an end of the second fin-type pattern 210 may not include a facet.

The upper liner 180 may extend along a sidewall of the first gate spacer 135, a sidewall of the second gate spacer 235, an upper surface of the first epitaxial pattern 140, an upper surface of the second epitaxial pattern 240, and the upper surface of the field insulating film 105.

The upper liner 180 may be entirely formed in the first region I and the second region II.

Further, the upper liner 180 may extend along at least a portion of an outer circumference of the first epitaxial pattern 140 and at least a portion of the second epitaxial pattern 240. The "outer circumference of the epitaxial pattern" as used herein refers to the outermost circumference of the epitaxial pattern protruding upward higher than the upper surface of the field insulating film 105 except a portion being in contact with the fin-type pattern.

The upper liner 180 may be an etch stop film for the first contact 170 and the second contact 270 formed on the first epitaxial pattern 140 and the second epitaxial pattern 240. Accordingly, the upper liner 180 may include a material having an etch selectivity with respect to an interlayer insulating film 190 described below.

Hereinbelow, it will be assumed for explanation purpose that the upper liner 180 includes silicon nitride (SiN).

The first stress liner 150 may be formed in the first region I, but not in the second region II.

The first stress liner 150 may be formed between the first gate spacer 135 and the upper liner 180, and between the upper surface of the first epitaxial pattern 140 and the upper liner 180. However, no first stress liner 150 is formed between the second gate spacer 235 and the upper liner 180, or between the upper surface of the second epitaxial pattern 240 and the upper liner 180.

That is, the first stress liner 150 is formed by extending along the upper surface of the first epitaxial pattern 140 and a sidewall of the first gate spacer 135, but the first stress liner 150 does not extend along the upper surface of the second epitaxial pattern 240 and the sidewall of the second gate spacer 235.

In other words, the first stress liner 150 may be formed by extending along at least a portion of an outer circumference of the first epitaxial pattern 140, but the first stress liner 150 does not extend along the outer circumference of the second epitaxial pattern 240.

The first stress liner 150 may be formed between the upper liner 180 and the field insulating film 105. The first stress liner 150 may be formed by extending along the upper surface of the field insulating film 105.

However, the first stress liner 150 may extend along a portion of the upper surface of the field insulating film 105 located between the first fin-type pattern 110 and the second fin-type pattern 210. That is, of the upper surface of the field insulating film 105, a portion in which no first stress liner 150 is formed may be present between the first fin-type pattern 110 and the second fin-type pattern 210.

The first stress liner 150 may include oxide of a material expanding in volume by the oxidation reaction.

For example, when silicon is oxidized, the volume is expanded. More specifically, when a first thickness silicon is oxidized, a second thickness of silicon oxide formed by the oxidation reaction is greater than the first thickness.

For example, a material expanding in volume by the oxidation reaction may be silicon, silicon germanium, germanium, aluminum, and so on, but not limited thereto. The first stress liner 150 may include at least one of silicon oxide, germanium oxide, and/or aluminum oxide, for example.

Example embodiments will be described below based on assumption that the first stress liner 150 includes a silicon oxide.

As described below about the fabricating method below, by forming the first stress liner 150 along the outer circumference of the first epitaxial pattern 140, the first epitaxial pattern 140 may be subject to the compressive stress from the first stress liner 150.

Since the first stress liner 150 applies the compressive stress to the first epitaxial pattern 140 included in the source/drain region of the PMOS, the device performance of the PMOS can be improved.

Additionally, it is possible to increase size of the first epitaxial pattern 140 for device performance of PMOS. However, when increasing the size of the first epitaxial pattern 140, bridge with neighboring devices, and so on, can occur, thus decreasing the performance and reliability of the semiconductor device.

However, by using the first stress liner 150 applying the compressive stress to the first epitaxial pattern 140, the device performance and reliability of the PMOS can be improved without requiring increased size of the first epitaxial pattern 140.

Referring to FIGS. 2A to 3B, the first stress liner 150 may be in contact with the upper liner 180. Further, the first stress liner 150 may be in contact with the first epitaxial pattern 140 and the first gate spacer 135. That is, the first stress liner 150 may be in contact with the first gate spacer 135, the first epitaxial pattern 140, and the upper liner 180.

Additionally, the field insulating film 105 in the first region I may be in contact with the first stress liner 150.

However, since no first stress liner 150 is formed in the second region II, the upper liner 180 may be in contact with the second gate spacer 235 and the second epitaxial pattern 240. Further, the field insulating film 105 in the second region II may be in contact with the upper liner 180.

The interlayer insulating film 190 may be formed on the substrate 100. More specifically, the interlayer insulating film 190 may be formed on the upper liner 180.

The interlayer insulating film 190 may include a lower interlayer insulating film 191, and an upper interlayer insulating film 192 on the lower interlayer insulating film 191.

The lower interlayer insulating film 191 may be in contact with the upper liner 180. The lower interlayer insulating film 191 may surround the sidewall of the first gate structure 120 and the sidewall of the second gate structure 220.

The upper surface of the lower interlayer insulating layer 191 may be in the same plane as the upper surface of the first gate electrode 130 and the upper surface of the second gate electrode 230.

For example, the lower interlayer insulating film 191 may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and/or a combination thereof, but not limited thereto.

The upper interlayer insulating film 192 may be formed on the first gate structure 120 and the second gate structure 220.

A boundary between the lower interlayer insulating film 191 and the upper interlayer insulating film 192 may be defined with reference to upper surfaces of the first gate structure 120 and the second gate structure 220.

For example, the upper interlayer insulating film 192 may include silicon oxide, silicon oxynitride, silicon nitride, flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and/or a combination thereof, but not limited thereto.

Referring to FIGS. 2B and 3B, the first contact 170 may be formed on the first epitaxial pattern 140, and connected to the first epitaxial pattern 140.

The second contact 270 may be formed on the second epitaxial pattern 240, and connected to the second epitaxial pattern 240.

The portion of the upper surface of the first epitaxial pattern 140 connected to the first contact 170, and the portion of the upper surface of the second epitaxial pattern 240 connected to the second contact 270 may each be recessed, although example embodiments are not limited thereto.

The first contact 170 and the second contact 270 may be formed within the interlayer insulating film 190, respectively.

Although not illustrated in FIGS. 2B and 3B, silicide layer may be formed between the first contact 170 and the first epitaxial pattern 140, and between the second contact 270 and the second epitaxial pattern 240, respectively.

The first contact 170 and the second contact 270 may include at least one of, for example, tantalum (Ta), tantalum nitride (TaN), titanium (Ti), titanium nitride (TiN), ruthenium (Ru), cobalt (Co), nickel (Ni), nickel boride (NiB), tungsten nitride (WN), aluminum (Al), tungsten (W), copper (Cu), cobalt (Co) and/or doped polysilicon.

While the first contact 170 and the second contact 270 are illustrated to be single patterns, this is only for convenience of explanation and the example embodiments are not limited thereto. The first contact 170 and the second contact 270 may each include a barrier film, and a filling film formed on the barrier film.

As illustrated in FIG. 2B, the first stress liner 150 and the upper liner 180 may be formed along a portion of the upper surface of the first epitaxial pattern 140, although example embodiments are not limited thereto.

In FIG. 2B illustrating a cross section taken along the lengthwise direction of the first fin-type pattern 110 and the second fin-type pattern, even when the size of the first contact 170 increases, the first stress liner 150 may be formed between the first gate spacer 135 and the upper liner 180.

However, when the size of the first contact 170 increases, the first stress liner 150 formed on the upper surface of the first epitaxial pattern 140 may be removed during a process of forming the first contact 170.

In this case, in the cross sectional view taken along the lengthwise direction of the first fin-type pattern 110 and the second fin-type pattern 210, the first stress liner 150 may be located between the first gate spacer 135 and the upper liner 180, and between the field insulating film 105 and the upper liner 180, but it may appear as if no first stress liner 150 is formed on the upper surface of the first epitaxial pattern 140.

Meanwhile, in FIG. 3B, even when the first stress liner 150 may be removed during the process of forming the first contact 170, the first stress liner 150 may be left on at least a portion of the outer circumference of the first epitaxial pattern 140.

The upper liner 180 formed on the upper surface of the first epitaxial pattern 140 is also left at a similar location as the first stress liner 150.

Hereinbelow, example embodiments are explained by referring to drawings in which illustration of the first contact 170 and the second contact 270 is omitted for convenience of explanation.

Figure 5:
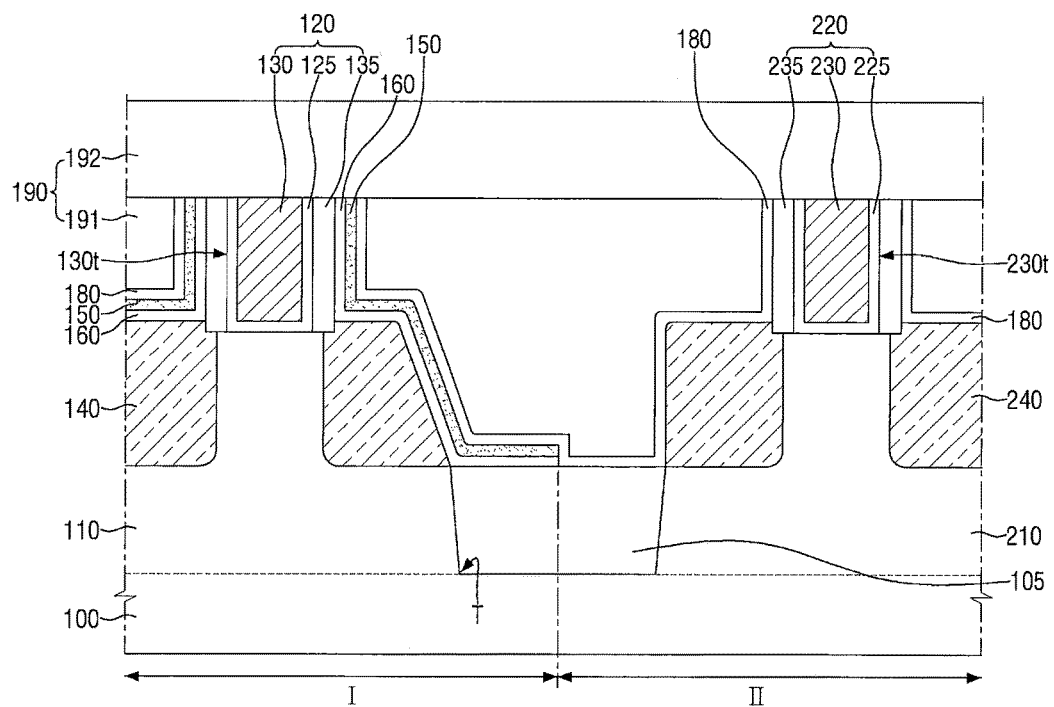
FIG. 5 is a view provided to explain a semiconductor device according to some example embodiments.
Figure 6:
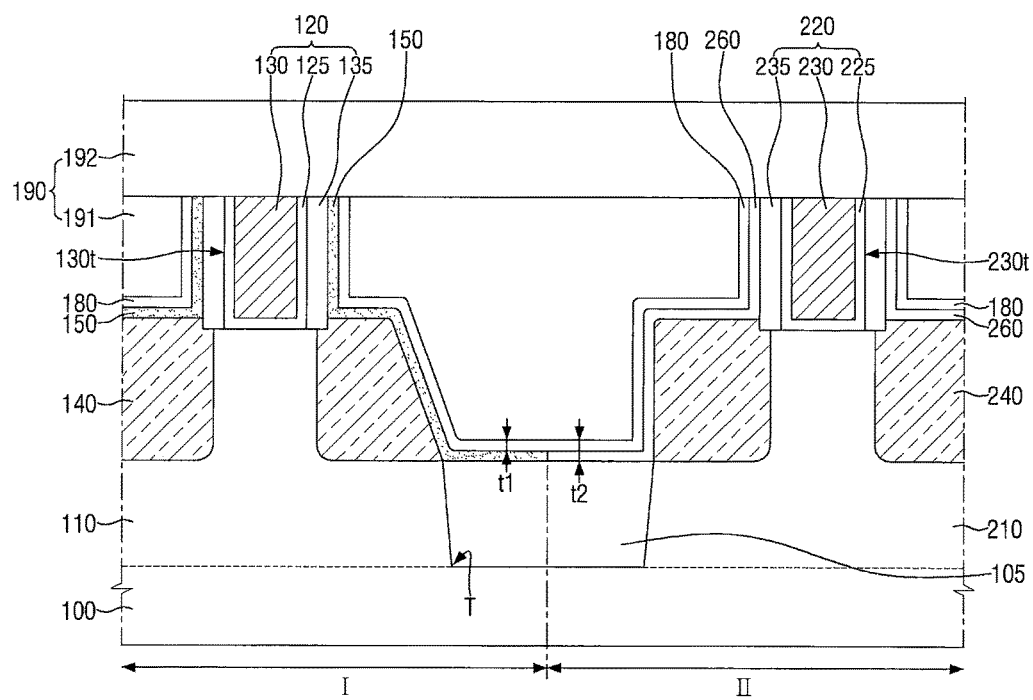
FIG. 6 is a view provided to explain a semiconductor device according to some example embodiments.
Figure 7:
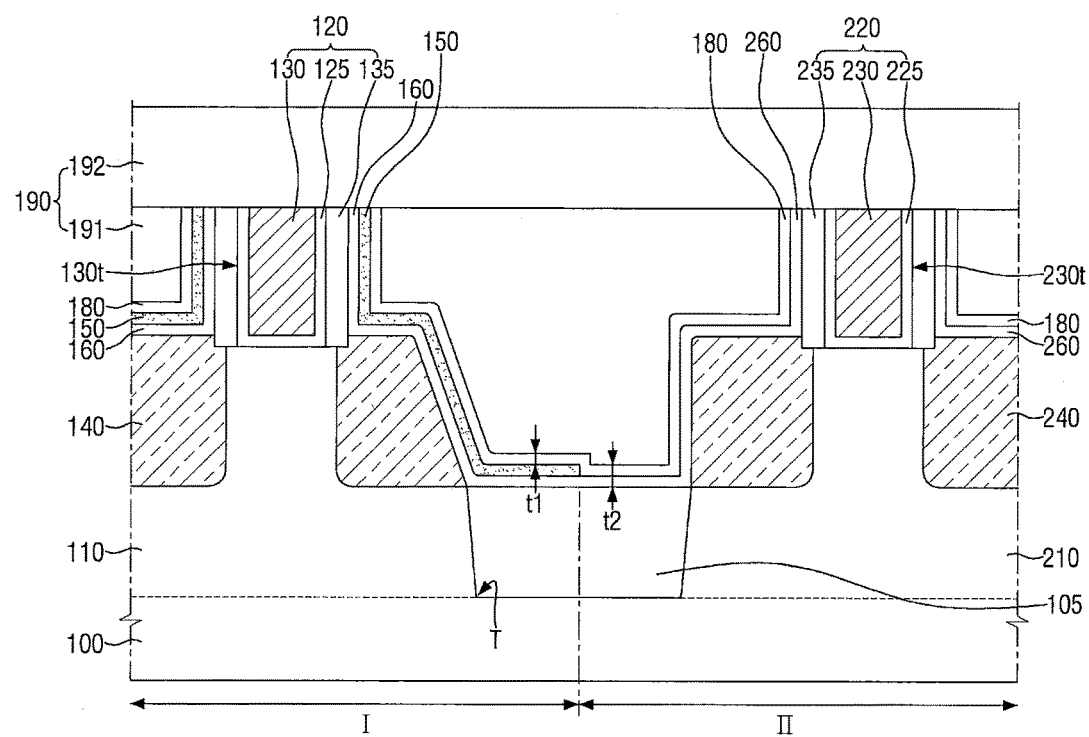
FIG. 7 is a view provided to explain a semiconductor device according to some example embodiments.
Figure 8:
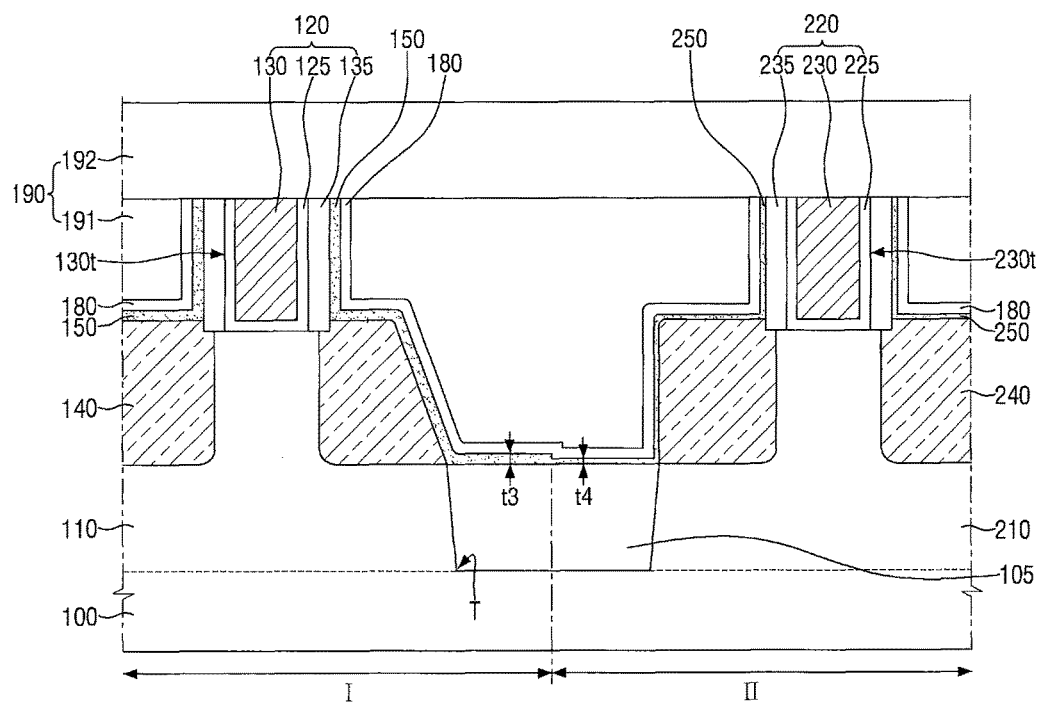
FIG. 8 are views provided to explain a semiconductor device according to some example embodiments.

FIG. 5 is a view provided to explain a semiconductor device according to some example embodiments. FIG. 6 is a view provided to explain a semiconductor device according to some example embodiments. FIG. 7 is a view provided to explain a semiconductor device according to some example embodiments. FIG. 8 is a view provided to explain a semiconductor device according to some example embodiments. For convenience of explanation, differences that are not explained above with reference to FIGS. 1 to 4C will be mainly explained below.

For reference, FIGS. 5 to 8 are cross sectional views taken on line A-A of FIG. 1.

Referring to FIG. 5, the semiconductor device according to some example embodiments may further include a first lower liner 160.

The first lower liner 160 may be formed in the first region I, but not in the second region II.

The first lower liner 160 may be formed between a first gate spacer 135 and a first stress liner 150, and between an upper surface of the first epitaxial pattern 140 and the first stress liner 150. However, no first lower liner 160 is formed between a second gate spacer 235 and an upper liner 180, or between the upper surface of the second epitaxial pattern 240 and the upper liner 180.

That is, the first lower liner 160 is formed by extending along the upper surface of the first epitaxial pattern 140 and a sidewall of the first gate spacer 135, but the first lower liner 160 does not extend along the upper surface of the second epitaxial pattern 240 and the sidewall of the second gate spacer 235.

In other words, the first lower liner 160 is formed by extending along at least a portion of an outer circumference of the first epitaxial pattern 140, but the first lower liner 160 does not extend along the outer circumference of the second epitaxial pattern 240.

The first lower liner 160 may be formed between the first stress liner 150 and the field insulating film 105. The first lower liner 160 may be formed by extending along the upper surface of the field insulating film 105.

However, the first lower liner 160 may extend along a portion of the upper surface of the field insulating film 105 located between the first fin-type pattern 110 and the second fin-type pattern 210. That is, of the upper surface of the field insulating film 105, a portion in which no first lower liner 160 is formed may be present between the first fin-type pattern 110 and the second fin-type pattern 210.

The first stress liner 150 may be formed between the first lower liner 160 and the upper liner 180. The first stress liner 150 may be in contact with the first lower liner 160 and the upper liner 180, respectively.

The first lower liner 160 may include at least one of, for example, silicon oxynitride, silicon nitride, and/or silicon carbonitride.

Example embodiments will be described below based on assumption that the first stress liner 160 includes a silicon nitride.

As illustrated in FIG. 5, an end of the first stress liner 150 and an end of the first lower liner 160 may be arranged in a row on the field insulating film 105, but this is provided only for convenience of explanation and the example embodiments are not limited thereto.

Referring to FIG. 6, the semiconductor device according to some example embodiments may further include a second lower liner 260.

The second lower liner 260 may be formed in the second region II, but not in the first region I.

The second lower liner 260 may be formed between the second gate spacer 235 and the upper liner 180, and between the upper surface of the second epitaxial pattern 240 and the upper liner 180. However, no second lower liner 260 is formed between the first gate spacer 135 and the upper liner 180, and between the upper surface of the first epitaxial pattern 140 and the upper liner 180.

That is, the second lower liner 260 is formed by extending along the upper surface of the second epitaxial pattern 240 and a sidewall of the second gate spacer 235, but the second lower liner 260 does not extend along the upper surface of the first epitaxial pattern 140 and the sidewall of the first gate spacer 135.

In other words, the second lower liner 260 may be formed by extending along at least a portion of an outer circumference of the second epitaxial pattern 240, but the second lower liner 260 does not extend along the outer circumference of the first epitaxial pattern 140.

The second lower liner 260 may be formed between the upper liner 180 and the field insulating film 105. The second lower liner 260 may extend along the upper surface of the field insulating film 105.

However, the second lower liner 260 may extend along a portion of the upper surface of the field insulating film 105 located between the first fin-type pattern 110 and the second fin-type pattern 210. That is, of the upper surface of the field insulating film 105, a portion in which no second lower liner 260 is formed may be present between the first fin-type pattern 110 and the second fin-type pattern 210.

The second lower liner 260 may include at least one of, for example, silicon oxynitride, silicon nitride, and/or silicon carbonitride.

Example embodiments will be described below based on assumption that the second lower liner 260 includes a silicon nitride.

As illustrated in FIG. 6, on the field insulating film 105, an end of the first stress liner 150 and an end of the second lower liner 260 may not be overlapped and in contact with each other, but this is provided only for convenience of explanation and the example embodiments are not limited thereto.

That is, on the field insulating film 105, a portion of the first stress liner 150 may be overlapped with a portion of the second lower liner 260, and the first stress liner 150 may not be in contact with the second lower liner 260.

Furthermore, the second lower liner 260 and the upper liner 180 may be a silicon nitride film, respectively. As illustrated in FIG. 6, the second lower liner 260 and the upper liner 180 may be distinguished, although example embodiments are not limited thereto. That is, because the second lower liner 260 and the upper liner 180 may each include a silicon nitride film so that the second lower liner 260 and the upper liner 180 are not distinguished, the second lower liner 260 and the upper liner 180 may seem as one silicon nitride film.

When the second lower liner 260 and the upper liner 180 may each include a silicon nitride film and a boundary between the second lower liner 260 and the upper liner 180 is not distinguished, a thickness t1 of the silicon nitride film on the first stress liner 150 is less than a thickness t2 of the silicon nitride film on the field insulating film 105 in the second region II.

Referring to FIG. 7, the semiconductor device according to some example embodiments may further include a first lower liner 160 and a second liner 260.

The first lower liner 160 may be formed in the first region I, and the second lower liner 260 may be formed in the second region II.

The first lower liner 160 may be formed between the first gate spacer 135 and the first stress liner 150, and between the upper surface of the first epitaxial pattern 140 and the first stress liner 150. The second lower liner 260 may be formed between the second gate spacer 235 and the upper liner 180, and between the upper surface of the second epitaxial pattern 240 and the upper liner 180.

The first lower liner 160 may be formed by extending along the upper surface of the first epitaxial pattern 140 and the sidewall of the first gate spacer 135. The second lower liner 260 may be formed by extending along the upper surface of the second epitaxial pattern 240 and the sidewall of the second gate spacer 235.

In other words, the first lower liner 160 may be formed by extending along at least a portion of an outer circumference of the first epitaxial pattern 140. The second lower liner 260 may extend along the outer circumference of the second epitaxial pattern 240.

The first lower liner 160 may be formed between the first stress liner 150 and the field insulating film 105. The second lower liner 260 may be formed between the upper liner 180 and the field insulating film 105.

The first lower liner 160 and the second lower liner 260 may be formed at a same level. The term "same level" as used herein refers to being formed by the same fabricating process. The first lower liner 160 and the second lower liner 260 may be directly connected to each other on the field insulating film 105.

When the second lower liner 260 and the upper liner 180 may each include a silicon nitride film and a boundary between the second lower liner 260 and the upper liner 180 is not distinguished, the thickness t1 of the silicon nitride film on the first stress liner 150 is less than the thickness t2 of the silicon nitride film on the field insulating film 105 in the second region II.

Referring to FIG. 8, the semiconductor device according to some example embodiments may further include a second stress liner 250.

The first stress liner 150 may be formed in the first region I, and the second stress liner 250 may be formed in the second region II.

The second stress liner 250 may be formed between the second gate spacer 235 and the upper liner 180, and between the upper surface of the second epitaxial pattern 240 and the upper liner 180. That is, the second stress liner 250 may be formed by extending along the upper surface of the second epitaxial pattern 240 and the sidewall of the second gate spacer 235.

In other words, the second stress liner 250 may be formed by extending along at least a portion of an outer circumference of the second epitaxial pattern 240.

The second stress liner 250 may be formed between the upper liner 180 and the field insulating film 105. The second stress liner 250 may be formed by extending along the upper surface of the field insulating film 105.

The second stress liner 250 may be in contact with the upper liner 180. Further, the second stress liner 250 may be in contact with the second epitaxial pattern 240 and the second gate spacer 235. That is, the second stress liner 250 may be in contact with the second gate spacer 235, the second epitaxial pattern 240, and the upper liner 180.

Additionally, the field insulating film 105 in the second region II may be in contact with the second stress liner 250.

The second stress liner 250 may include oxide of a material expanding in volume by the oxidation reaction. The second stress liner 250 may include at least one of silicon oxide, germanium oxide, and/or aluminum oxide, for example.

Example embodiments will be described below based on assumption that the second stress liner 250 includes a silicon oxide.

On the field insulating film 105, the second stress liner 250 may be directly connected to the first stress liner 150.

A thickness t3 of the first stress liner 150 may be different from a thickness t4 of the second stress liner 250. For example, the thickness t3 of the first stress liner 150 in the first region I as a PMOS formation region may be greater than the thickness t4 of the second stress liner 250 in the second region II as an NMOS formation region.

Meanwhile, unlike the example described above, both the first region I and the second region II may be PMOS formation regions or NMOS formation regions. In this case, the thickness t3 of the first stress liner 150 and the thickness t4 of the second stress liner 250 may be varied. As a result, although same conductive types of transistors may be formed in the first region I and the second region II, device performance of the transistor formed in the first region I and device performance of the transistor formed in the second region II may be different.

Figure 9:
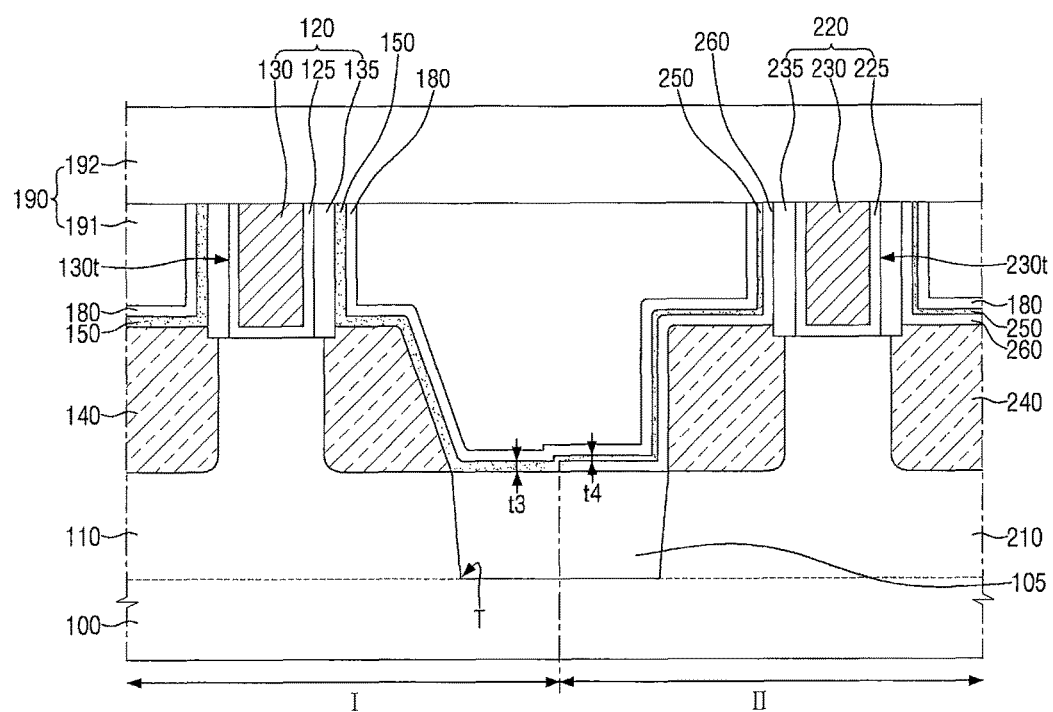
FIG. 9 is a view provided to explain a semiconductor device according to some example embodiments.

FIG. 9 is a view provided to explain to explain a semiconductor device according to some example embodiments. For convenience of explanation, differences that are not explained above with reference to FIG. 8 will be mainly explained below.

Referring to FIG. 9, the semiconductor device according to some example embodiments may further include a second lower liner 260.

The second lower liner 260 may be formed in the second region II, but not in the first region I.

The second lower liner 260 may be formed between the second gate spacer 235 and the second stress liner 250, and between the upper surface of the second epitaxial pattern 240 and the second stress liner 250. However, no second lower liner 260 is formed between the first gate spacer 135 and the upper liner 180, and between the upper surface of the first epitaxial pattern 140 and the upper liner 180.

That is, the second lower liner 260 is formed by extending along the upper surface of the second epitaxial pattern 240 and a sidewall of the second gate spacer 235, but the second lower liner 260 does not extend along the upper surface of the first epitaxial pattern 140 and the sidewall of the first gate spacer 135.

In other words, the second lower liner 260 is formed by extending along at least a portion of an outer circumference of the second epitaxial pattern 240, but the second lower liner 260 does not extend along the outer circumference of the first epitaxial pattern 140.

The second lower liner 260 may be formed between the second stress liner 250 and the field insulating film 105. The second lower liner 260 may be formed by extending along the upper surface of the field insulating film 105.

However, the second lower liner 260 may extend along a portion of the upper surface of the field insulating film 105 located between the first fin-type pattern 110 and the second fin-type pattern 210. That is, of the upper surface of the field insulating film 105, a portion in which no second lower liner 260 is formed may be present between the first fin-type pattern 110 and the second fin-type pattern 210.

The second stress liner 250 may be in contact with the second lower liner 260 and the upper liner 180, respectively.

Unlike the example as illustrated in FIG. 9, the first lower liner 160 described with reference to FIG. 7 may be formed between the first stress liner 150 and the field insulating film 105, between the first stress liner 150 and the first gate spacer 135, and between the first stress liner 150 and the first epitaxial pattern 140.

Figure 10:
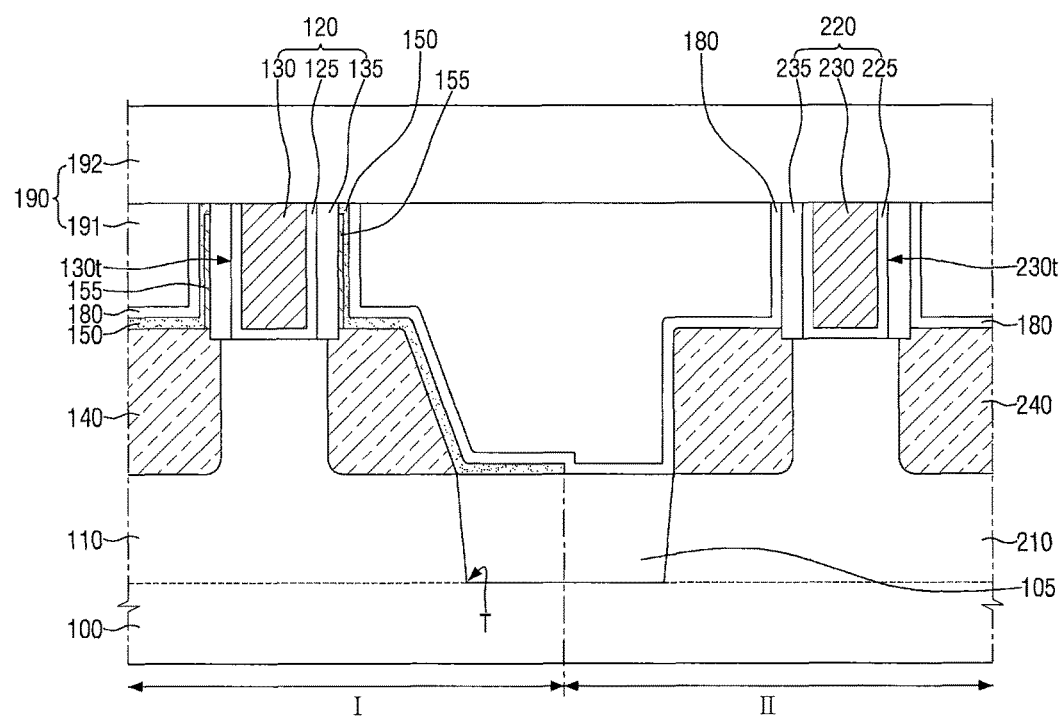
FIG. 10 is a view provided to explain a semiconductor device according to some example embodiments.
Figure 11:
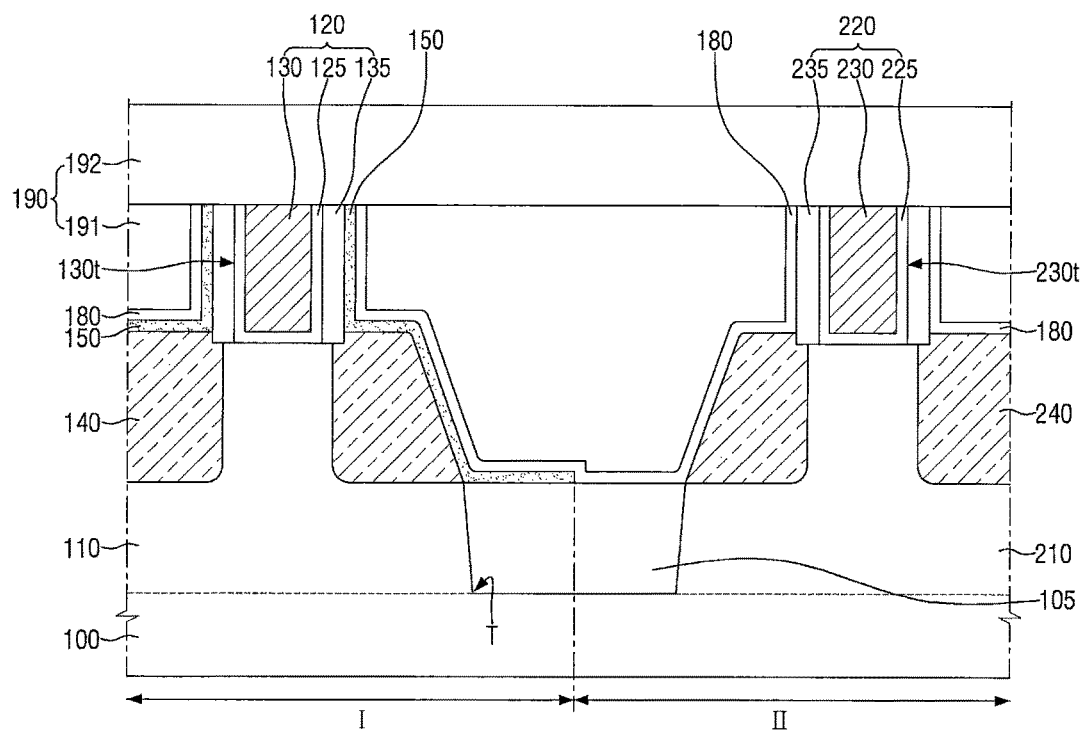
FIG. 11 is a view provided to explain a semiconductor device according to some example embodiments.
Figure 12:
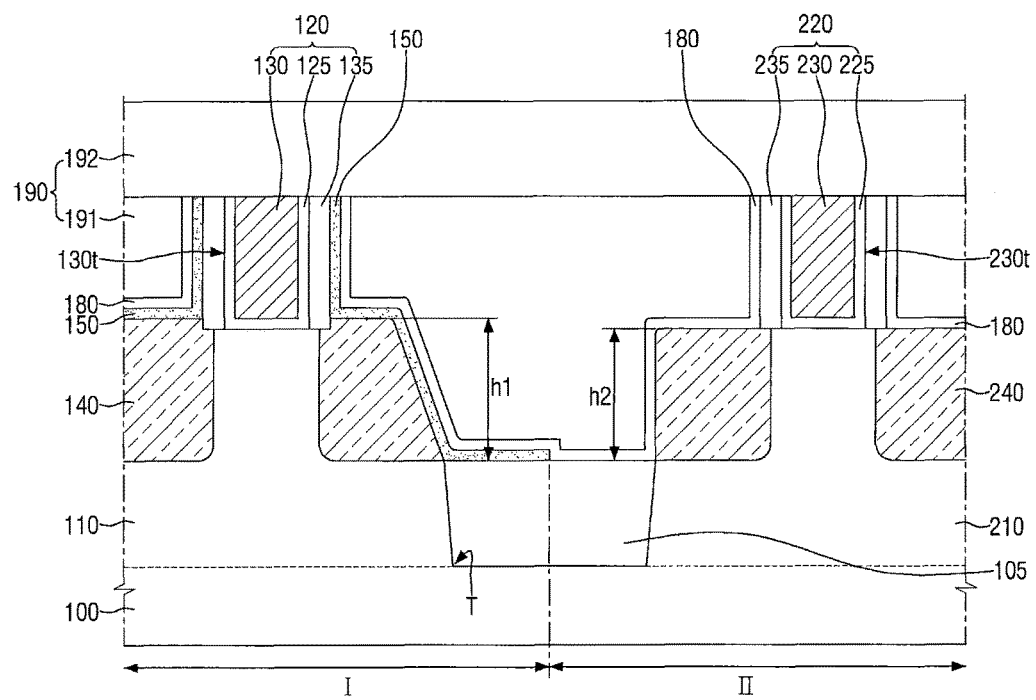
FIG. 12 is a view provided to explain a semiconductor device according to some example embodiments.

FIG. 10 is a view provided to explain a semiconductor device according to some example embodiments. FIG. 11 is a view provided to explain a semiconductor device according to some example embodiments. FIG. 12 is a view provided to explain a semiconductor device according to some example embodiments. For convenience of explanation, differences that are not explained above with reference to FIGS. 1 to 4C will be mainly explained below.

Referring to FIG. 10, the semiconductor device according to some example embodiments may further include a conductive liner 155 formed between the first stress liner 150 and the sidewall of the first gate spacer 135.

The conductive liner 155 is formed in the first region I, but not in the second region II.

The conductive liner 155 may appear in a process in which the first stress liner 150 is formed. More specifically, the first stress liner 150 is formed by oxidizing a material expanding in volume by the oxidization reaction. At this time, a portion of the material expanding in volume by the oxidation reaction may be not oxidized. In this case, the conductive liner 155 may be formed.

The conductive liner 155 may include silicon, silicon germanium, germanium, aluminum, and so on, for example. When the conductive liner 155 includes silicon, silicon germanium, and germanium, the conductive liner 155 may be a semiconductor liner. On the other hand, when the conductive liner 155 includes aluminum, the conductive liner 155 may be a metal liner.

As illustrated in FIG. 10, the conductive liner 155 may be located between the first stress liner 150 and a sidewall of the first gate spacer 135, although example embodiments are not limited thereto.

Further, as illustrated in FIG. 10, the conductive liner 155 may be a line pattern extending along the sidewall of the first gate spacer 135, although example embodiments are not limited thereto. That is, the conductive liner 155 may be a spot-like pattern.

Referring to FIG. 11, in a semiconductor device according to some example embodiments, the first epitaxial pattern 140 formed in the end of the first fin-type pattern 110 and the second epitaxial pattern 240 formed in the end of the second fin-type pattern 210 may each include a facet.

More specifically, in a cross sectional view taken along the lengthwise direction of the first fin-type pattern 110 and the second fin-type pattern 210, the first epitaxial pattern 140 and the second epitaxial pattern 240 which are facing each other with the field insulating film 105 interposed therebetween may include facets, respectively.

Referring to FIG. 12, in a semiconductor device according to some example embodiments, a height h1 from the upper surface of the field insulating film 105 to an uppermost portion of the first epitaxial pattern 140 may be different from a height h2 from the upper surface of the field insulating film 105 to an uppermost portion of the second epitaxial pattern 240.

For example, the height h1 from the upper surface of the field insulating film 105 to the uppermost portion of the first epitaxial pattern 140 may be greater than the height h2 from the upper surface of the field insulating film 105 to the uppermost portion of the second epitaxial pattern 240.

Figure 13:
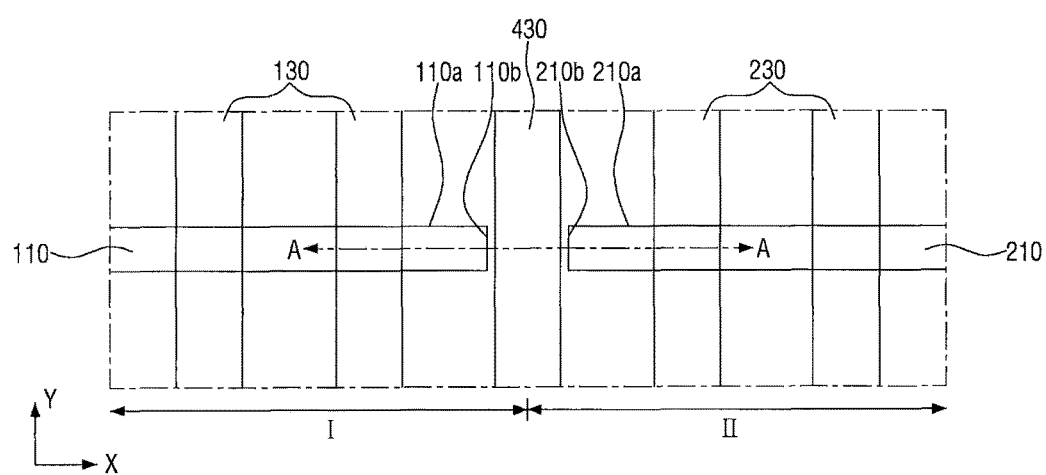
FIG. 13 is a layout diagram provided to explain a semiconductor device according to some example embodiments.
Figure 14:
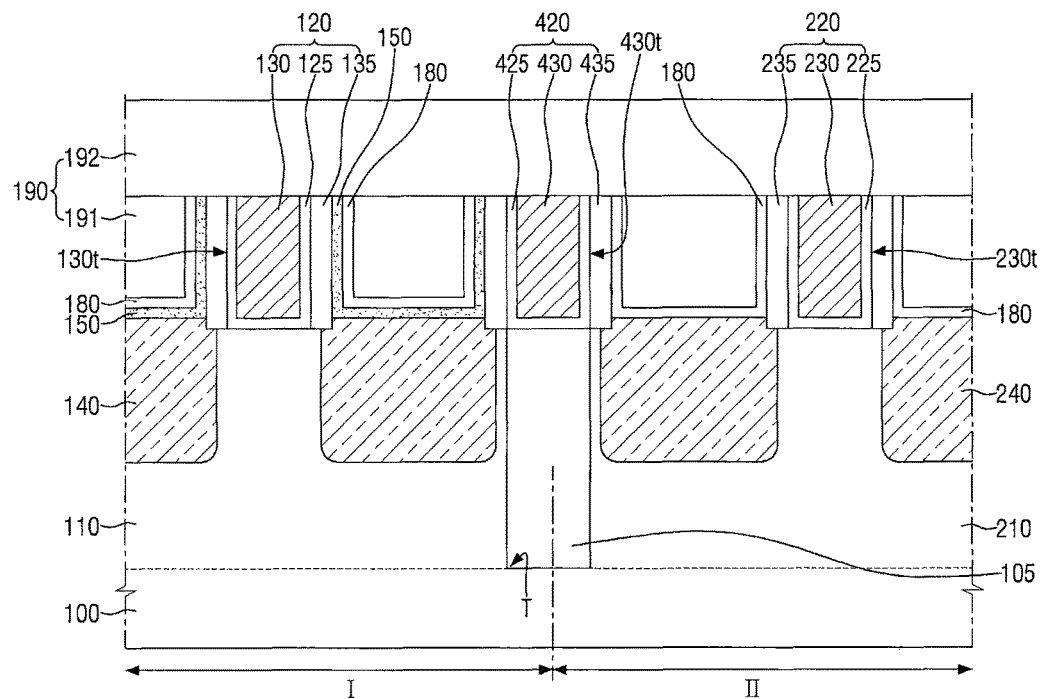
FIG. 14 is a cross sectional view taken on line A-A of FIG. 13.

FIG. 13 is a layout diagram provided to explain a semiconductor device according to some example embodiments. FIG. 14 is a cross sectional view taken on line A-A of FIG. 13. For convenience of explanation, differences that are not explained above with reference to FIGS. 1 to 4C will be mainly explained below.

Referring to FIGS. 13 and 14, a semiconductor device according to some example embodiments may further include a first dummy metal gate structure 420 disposed between a short side 110b of the first fin-type pattern 110 and a short side 210b of the second fin-type pattern 210.

The upper surface of the field insulating film 105 located between the short side 110b of the first fin-type pattern 110 and the short side 210b of the second fin-type pattern 210 may be higher than or equal to the upper surface of the first fin-type pattern 110 and the upper surface of the second fin-type pattern 210.

The first dummy metal gate structure 420 may include a first dummy metal gate electrode 430, a first dummy insulating film 425, and a first dummy gate spacer 435.

The first dummy gate spacer 435 may define a first dummy gate trench 430t. The first dummy insulating layer 425 may be formed along a sidewall and a bottom surface of the first dummy gate trench 430t. The first dummy metal gate electrode 430 may be formed on the first dummy insulating film 425 and may fill the first dummy gate trench 430t.

A portion of the first fin-type pattern 110 may be interposed between the first epitaxial pattern 140 and the field insulating film 105. A portion of the second fin-type pattern 210 may be interposed between the second epitaxial pattern 240 and the field insulating film 105.

The first stress liner 150 may be formed between the upper liner 180 and the first dummy gate spacer 435 adjacent to the first gate electrode 130. The first stress liner 150 may extend along the sidewall of the first dummy gate spacer 435 adjacent the first gate electrode 130.

However, the first stress liner 150 may not be formed between the upper liner 180 and the first dummy gate spacer 435 adjacent the second gate electrode 230.

That is, the first stress liner 150 may be formed on the sidewall of the first dummy gate structure 420 adjacent the first gate electrode 130 around the first dummy metal gate electrode 430.

On the other hand, no first stress liner 150 may be formed on the sidewall of the first dummy gate structure 420 adjacent the second gate electrode 230 around the first dummy metal gate electrode 430.

Figure 15:
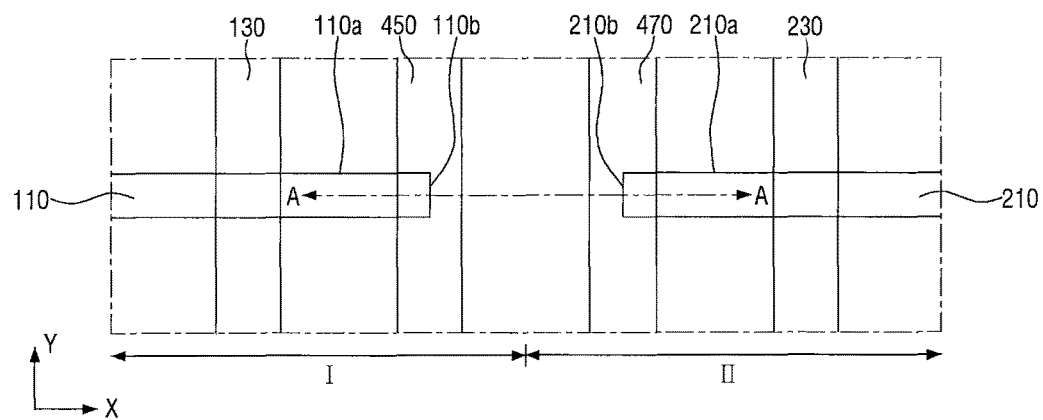
FIG. 15 is a layout diagram provided to explain a semiconductor device according to some example embodiments.
Figure 16:
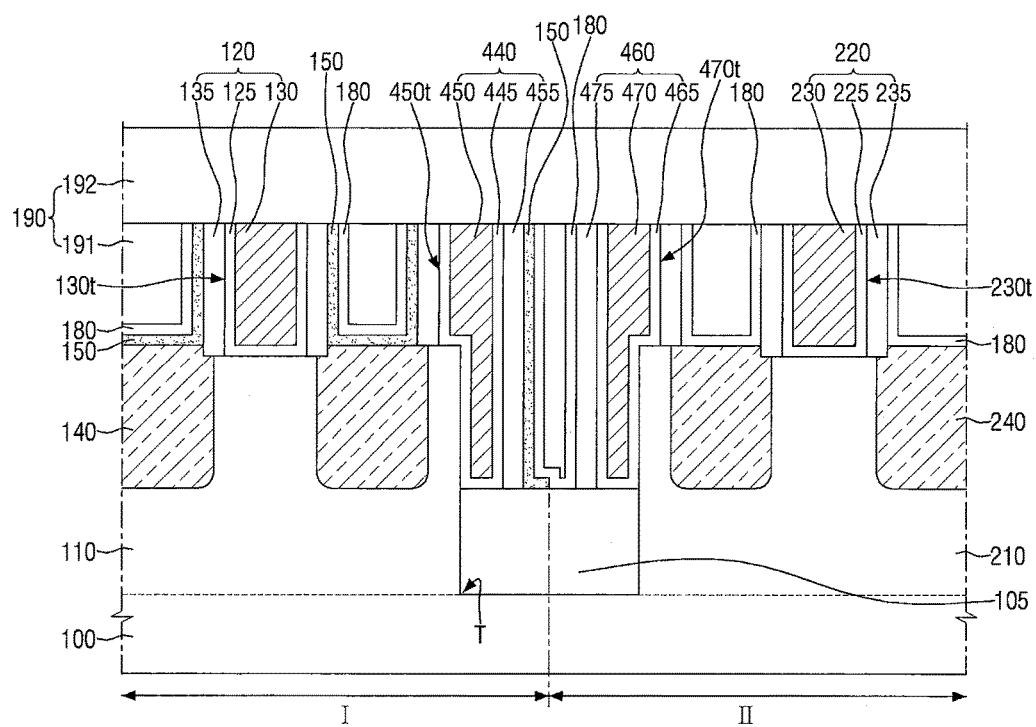
FIG. 16 is a cross sectional view taken on line A-A of FIG. 15.

FIG. 15 is a layout diagram provided to explain a semiconductor device according to some example embodiments. FIG. 16 is a cross sectional view taken on line A-A of FIG. 15. For convenience of explanation, differences that are not explained above with reference to FIGS. 1 to 4C will be mainly explained below.

Referring to FIGS. 15 and 16, a semiconductor device according to some example embodiments may further include a second dummy metal gate structure 440 surrounding the end of the first fin-type pattern 110, and a third dummy metal gate structure 460 surrounding the end of the second fin-type pattern 210.

The second dummy metal gate structure 440 may include a second dummy metal gate electrode 450, a second dummy insulating film 445, and a second dummy gate spacer 455.

The second dummy gate spacer 455 may define a second dummy gate trench 450t. The second dummy insulating film 445 may be formed along a sidewall and a bottom surface of the second dummy gate trench 450t. The second dummy metal gate electrode 450 may be formed on the second dummy insulating film 425 and may fill the second dummy gate trench 450t.

The third dummy metal gate structure 460 may include a third dummy metal gate electrode 470, a third dummy insulating film 465, and a third dummy gate spacer 475.

The third dummy gate spacer 475 may define a third dummy gate trench 470t. The third dummy insulating film 465 may be formed along a sidewall and a bottom surface of the third dummy gate trench 470t. The third dummy metal gate electrode 470 may be formed on the third dummy insulating film 465 and may fill the third dummy gate trench 470t.

The first stress liner 150 may be formed between the second dummy gate spacer 455 and the upper liner 180. The first stress liner 150 may extend along the sidewall of the second dummy gate spacer 455.

The first stress liner 150 between the second dummy metal gate structure 440 and the third dummy metal gate structure 460 may be in L-shape, but not limited thereto.

However, no first stress liner 150 may be formed between the third dummy gate spacer 475 and the upper liner 180.

As illustrated in FIGS. 15 and 16, no other dummy metal gate electrode may be present between the second metal gate structure 440 and the third dummy metal gate structure 460. However, this is provided only for convenience of illustration and example embodiments are not limited thereto.

Figure 17:
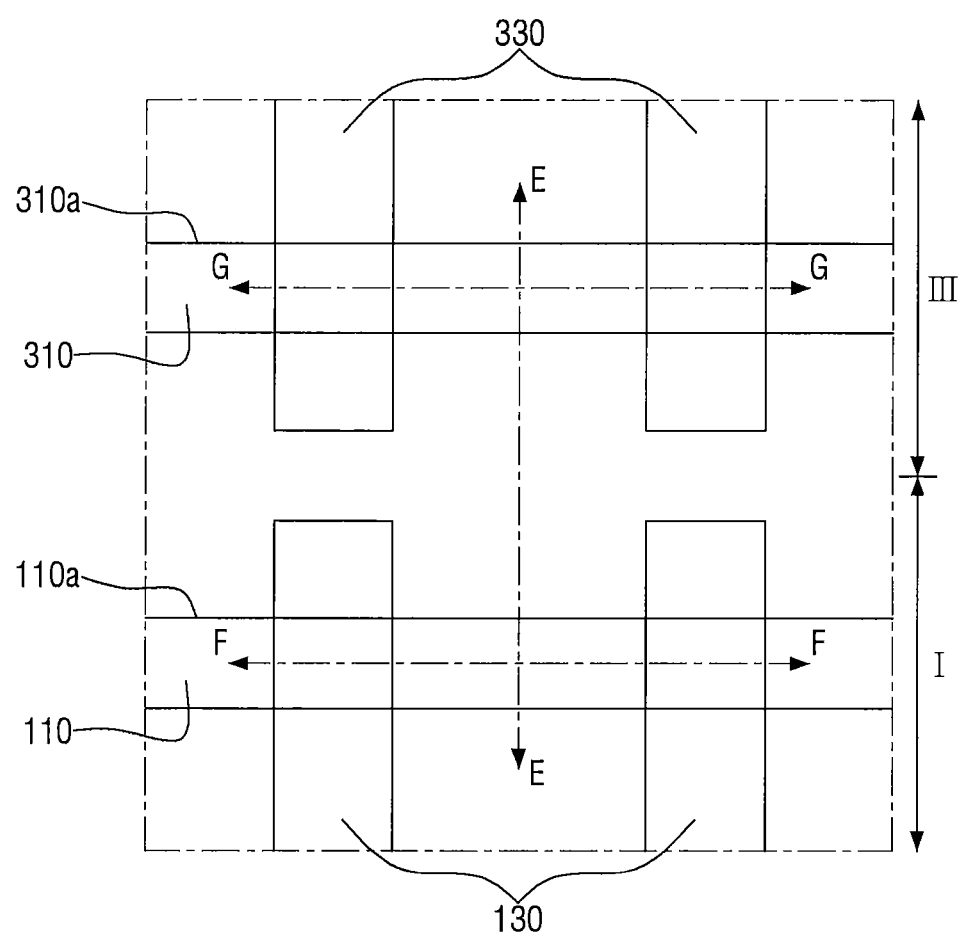
FIG. 17 is a layout diagram provided to explain a semiconductor device according to some example embodiments.
Figure 18:
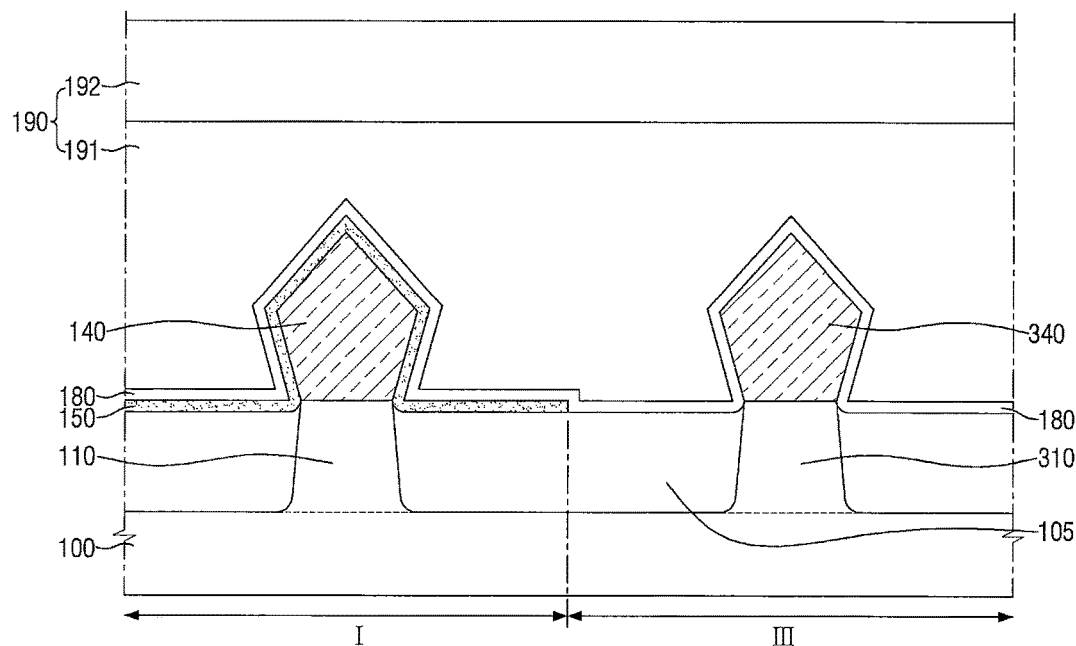
FIG. 18 is a cross sectional view taken on line E-E of FIG. 17.
Figure 19:
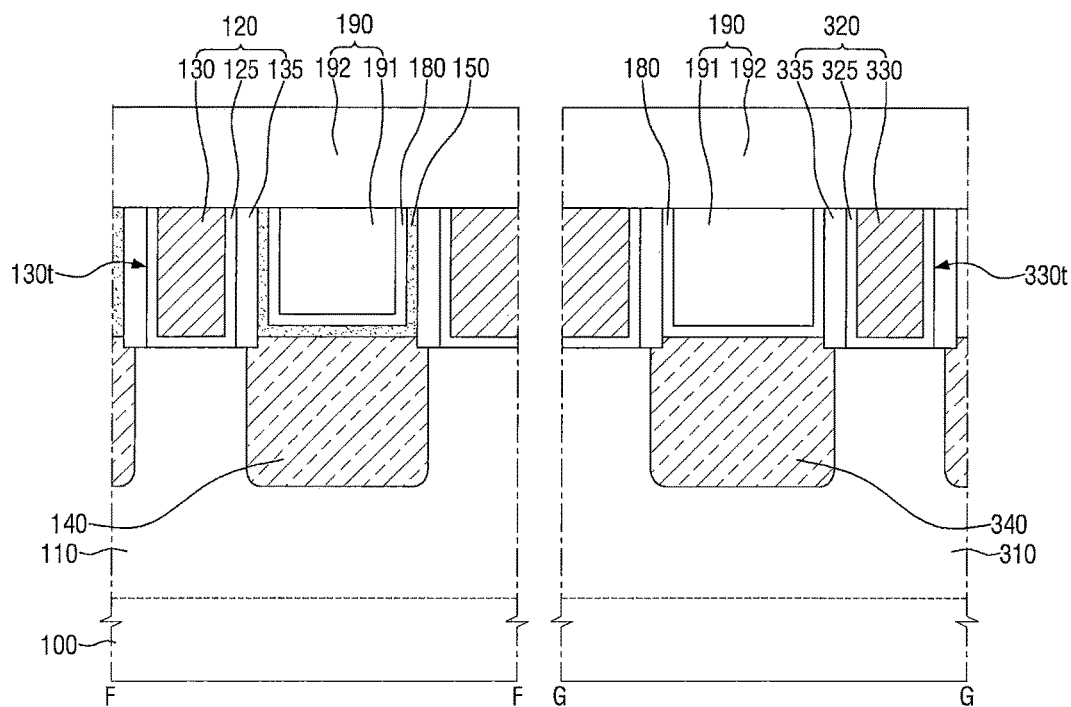
FIG. 19 are cross sectional views taken on lines F-F and G-G of FIG. 17.

FIG. 17 is a layout diagram provided to explain a semiconductor device according to some example embodiments. FIG. 18 is a cross sectional view taken on line E-E of FIG. 17. FIG. 19 are cross sectional views taken on lines F-F and G-G of FIG. 17.

For reference, overlapping description with respect to FIGS. 1 to 16 will be made briefly or omitted for the sake of brevity.

Referring to FIGS. 17 to 19, the semiconductor device according to some example embodiments may include a first fin-type pattern 110, a third fin-type pattern 310, a first gate structure 120, a third gate structure 320, a first epitaxial pattern 140, a third epitaxial pattern 340, a first stress liner 150, and an upper liner 180.

The substrate 100 may include a first region I and a third region III. The first region I and the third region III may be spaced apart from each other, or connected to each other.

To easily explain a positional relationship of the upper liner 180 and the first stress liner 150 between the first region I and the third region III, FIGS. 17 and 18 illustrate the first region I and the third region III being connected to each other, but example embodiments are not limited thereto.

Further, the transistor formed in the first region I and the transistor formed in the third region III may be of a same type, or different types from each other.

Hereinbelow, it will be explained herein that the first region I is a PMOS formation region, and the third region III is an NMOS formation region.

The first fin-type pattern 110 may be formed on the substrate 100 in the first region I. For example, the first fin-type pattern 110 may protrude from the substrate 100.

The third fin-type pattern 310 may be formed on the substrate 100 in the third region III. For example, the third fin-type pattern 310 may protrude from the substrate 100.

The first fin-type pattern 110 and the third fin-type pattern 310 may each be elongated in a first direction X. The first fin-type pattern 110 and the third fin-type pattern 310 may be formed at distance apart from each other.

The first fin-type pattern 110 and the third fin-type pattern 310 may be formed such that the long side 110a of the first fin-type pattern 110 faces the long side 310a of the third fin-type pattern 310. The first fin-type pattern 110 and the third fin-type pattern 310 elongated in the first direction X may be arranged adjacent in the second direction Y.

Since the first fin-type pattern 110 is used as the channel region of the PMOS and the third fin-type pattern 310 is used as the channel region of the NMOS, the first fin-type pattern 110 and the third fin-type pattern 310 may include different materials from each other.

For convenience of explanation, in the semiconductor device according to example embodiments, it is assumed that the first fin-type pattern 110 and the third fin-type pattern 310 are silicon fin-type patterns.

The field insulating film 105 may be formed between the first fin-type pattern 110 and the third fin-type pattern 310.

As illustrated FIG. 18, the first region I and the third region III may be distinguished at the field insulating film 105 equidistant from the first fin-type pattern 110 and the third fin-type pattern 310, although example embodiments are not limited thereto.

That is, since the manner in which the first region I is distinguished from the third region III is presented herein only for notion and for explanation, a boundary between the first region I and the third region III may instead lean to the first fin-type pattern 110 or the third fin-type pattern 310.

The first gate structure 120 may be formed on the substrate 100 in the first region I, while extending in the second direction Y. The first gate structure 120 may be formed on the first fin-type pattern 110, while intersecting the first fin-type pattern 110.

The first gate structure 120 may include a first gate electrode 130, a first gate insulating film 125, and a first gate spacer 135.

The third gate structure 320 may be formed on the substrate 100 in the third region III, while extending in the second direction Y. The third gate structure 320 may be formed on the third fin-type pattern 310, while intersecting the third fin-type pattern 310.

The third gate structure 320 may include a third gate electrode 330, a third gate insulating film 325, and a third gate spacer 335.

As illustrated, the first gate electrode 130 and the third gate electrode 330 may be isolated from each other, but example embodiments are not limited thereto. A portion of the first gate electrode 130 intersecting the first fin-type pattern 110 may be directly connected to the third gate electrode 330 intersecting the third fin-type pattern 310.

The third gate electrode 330 and the third gate insulating film 325 may be formed within the third trench 330t defined by the third gate spacer 335.

A first epitaxial pattern 140 may be formed on opposite sides of the first gate structure 120. The first epitaxial pattern 140 may be formed on the first fin-type pattern 110. The first epitaxial pattern 140 may be included in the source/drain region, for example.

A third epitaxial pattern 340 may be formed on opposite sides of the third gate structure 320. The third epitaxial pattern 340 may be formed on the third fin-type pattern 310. The third epitaxial pattern 340 may be included in the source/drain region, for example.

The third epitaxial pattern 340 may include a second impurity. Since the third epitaxial pattern 340 may be included in the source/drain region of the NMOS, the third epitaxial pattern 340 may include an n-type impurity.

The third epitaxial pattern 340 may include, for example, a tensile stress material. When the third fin-type pattern 310 is silicon, the third epitaxial pattern 340 may include a material such as SiC that has a smaller lattice constant than the silicon. For example, the tensile stress material can enhance carrier mobility in the channel region by exerting tensile stress on the third fin-type pattern 310.

Meanwhile, the third epitaxial pattern 340 may include a material same as the third fin-type pattern 310, that is, silicon.

The upper liner 180 may be formed along a sidewall of the first gate spacer 135, a sidewall of the third gate spacer 335, the upper surface of the first epitaxial pattern 140, the upper surface of the third epitaxial pattern 340, and the upper surface of the field insulating film 105.

The upper liner 180 may be entirely formed in the first region I and the third region III.

Further, the upper liner 180 may extend along at least a portion of an outer circumference of the first epitaxial pattern 140 and at least a portion of the third epitaxial pattern 340.

The first stress liner 150 may be formed in the first region I, but not in the third region III.

The first stress liner 150 may be formed between the first gate spacer 135 and the upper liner 180, and between the upper surface of the first epitaxial pattern 140 and the upper liner 180. However, no first stress liner 150 is formed between the third gate spacer 335 and the upper liner 180, and between the upper surface of the third epitaxial pattern 340 and the upper liner 180.

The first stress liner 150 may be formed by extending along at least a portion of an outer circumference of the first epitaxial pattern 140, but the first stress liner 150 does not extend along the outer circumference of the third epitaxial pattern 340.

The first stress liner 150 may be formed between the upper liner 180 and the field insulating film 105. The first stress liner 150 may formed by extending along the upper surface of the field insulating film 105.

However, the first stress liner 150 may extend along a portion of the upper surface of the field insulating film 105 located between the first fin-type pattern 110 and the third fin-type pattern 310. That is, of the upper surface of the field insulating film 105, a portion in which no first stress liner 150 is formed may be present between the first fin-type pattern 110 and the third fin-type pattern 310.

The first stress liner 150 may be in contact with the upper liner 180. Further, the first stress liner 150 may be in contact with the first epitaxial pattern 140 and the first gate spacer 135. That is, the first stress liner 150 may be in contact with the first gate spacer 135, the first epitaxial pattern 140, and the upper liner 180.

Additionally, the field insulating film 105 in the first region I may be in contact with the first stress liner 150.

However, since no first stress liner 150 is formed in the third region III, the upper liner 180 may be in contact with the third gate spacer 335 and the third epitaxial pattern 340. Further, the field insulating film 105 in the third region III may be in contact with the upper liner 180.

Figure 20:
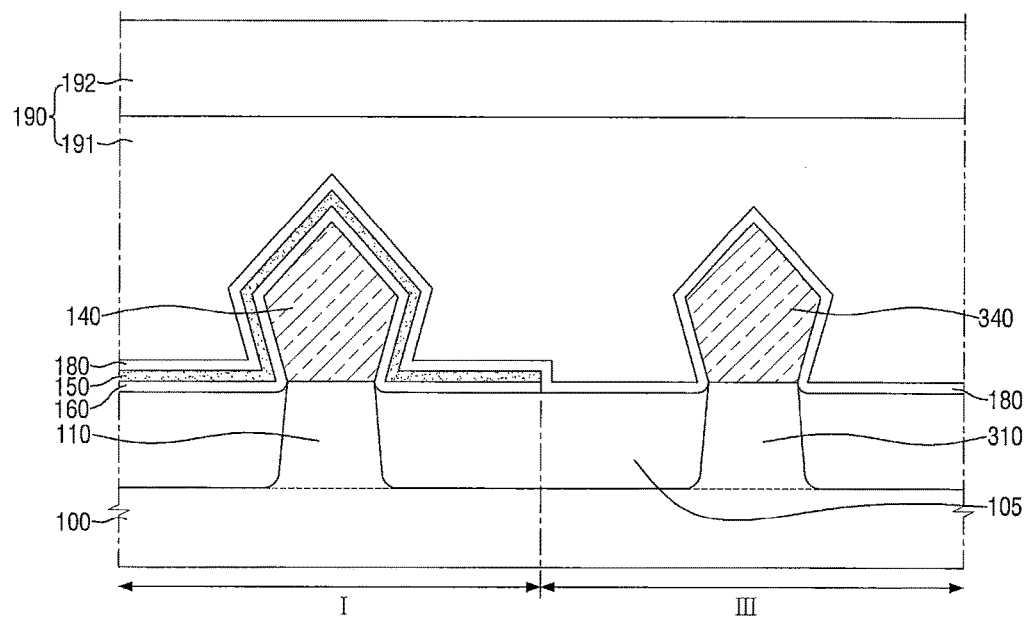
FIG. 20 is view provided to explain a semiconductor device according to some example embodiments.
Figure 21:
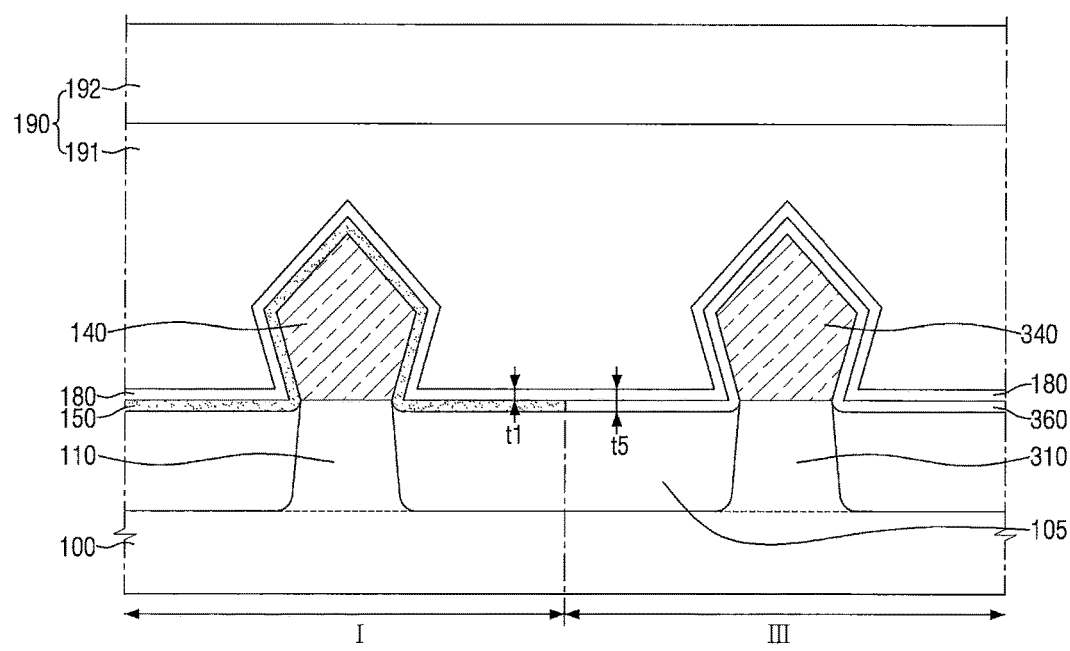
FIG. 21 is a view provided to explain a semiconductor device according to some example embodiments.
Figure 22:
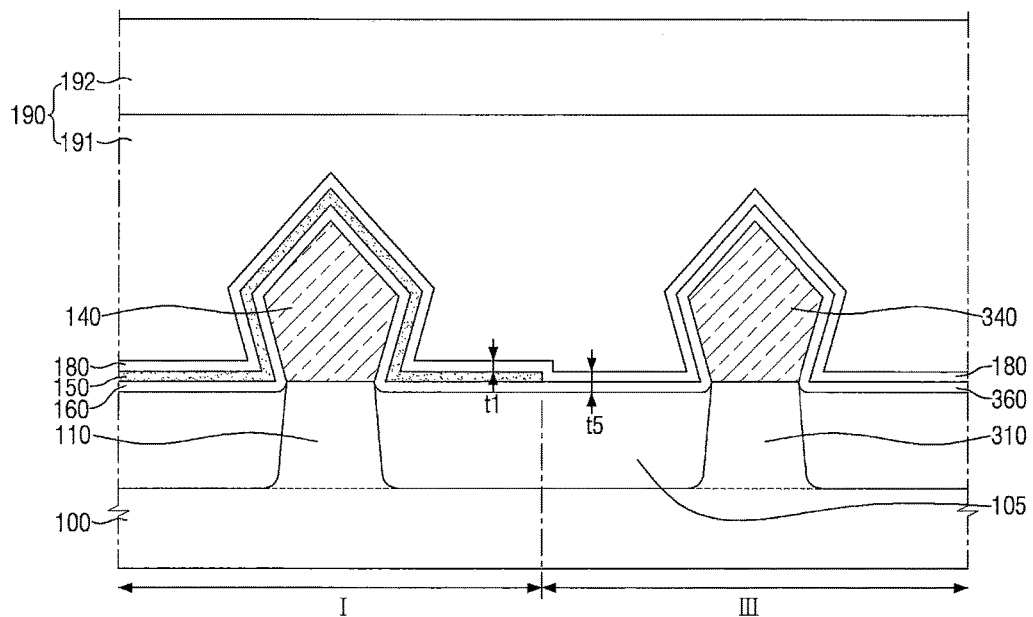
FIG. 22 is a view provided to explain a semiconductor device according to some example embodiments.
Figure 23:
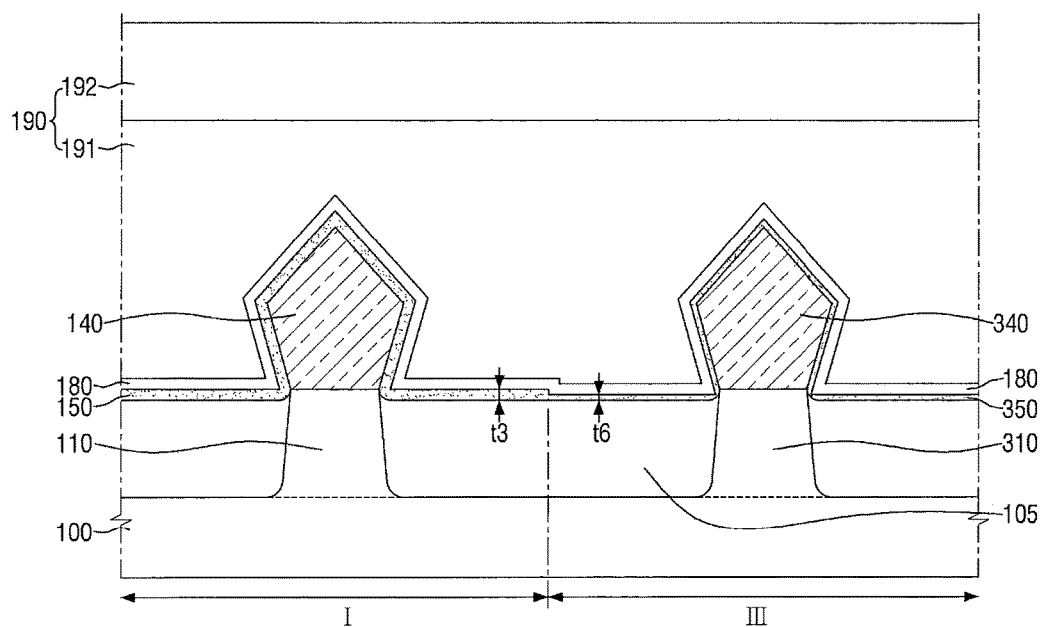
FIG. 23 is a view provided to explain a semiconductor device according to some example embodiments.

FIG. 20 is a view provided to explain a semiconductor device according to some example embodiments. FIG. 21 is view provided to explain a semiconductor device according to some example embodiments. FIG. 22 is a view provided to explain a semiconductor device according to some example embodiments. FIG. 23 is a view provided to explain a semiconductor device according to some example embodiments. For convenience of explanation, differences that are not explained above with reference to FIGS. 17 to 19 will be mainly explained below.

For reference, FIGS. 20 to 23 are cross sectional views taken on line E-E of FIG. 17.

Referring to FIG. 20, the semiconductor device according to some example embodiments may further include a first lower liner 160.

The first lower liner 160 may be formed in the first region I, but not in the third region III.

The first lower liner 160 may be formed by extending along at least a portion of an outer circumference of the first epitaxial pattern 140, but the first lower liner 160 does not extend along the outer circumference of the third epitaxial pattern 340.

The first lower liner 160 may be formed between the first stress liner 150 and the field insulating film 105. The first lower liner 160 may extend along the upper surface of the field insulating film 105.

However, the first lower liner 160 may extend along a portion of the upper surface of the field insulating film 105 located between the first fin-type pattern 110 and the third fin-type pattern 310. That is, of the upper surface of the field insulating film 105, a portion in which no first lower liner 160 is formed may be present between the first fin-type pattern 110 and the third fin-type pattern 310.

Referring to FIG. 21, the semiconductor device according to some example embodiments may further include a third lower liner 360.

The third lower liner 360 may be formed in the third region III, but not in the first region I.

The third lower liner 360 may be formed by extending along at least a portion of an outer circumference of the third epitaxial pattern 340, but the third lower liner 360 does not extend along the outer circumference of the first epitaxial pattern 140.

The third lower liner 360 may be formed between the upper liner 180 and the field insulating film 105. The third lower liner 360 may be formed by extending along the upper surface of the field insulating film 105.

However, the third lower liner 360 may extend along a portion of the upper surface of the field insulating film 105 located between the first fin-type pattern 110 and the third fin-type pattern 310. That is, of the upper surface of the field insulating film 105, a portion in which no third lower liner 360 is formed may be present between the first fin-type pattern 110 and the third fin-type pattern 310.

The third lower liner 360 may include at least one of, for example, silicon oxynitride, silicon nitride, or silicon carbonitride.

Example embodiments will be described below based on an assumption that the third lower liner 360 includes a silicon nitride.

As illustrated in FIG. 21, on the field insulating film 105, an end of the first stress liner 150 and an end of the third lower liner 360 may not be overlapped and may be in contact with each other, but this is provided only for convenience of explanation and the example embodiments are not limited thereto.

That is, on the field insulating film 105, a portion of the first stress liner 150 may be overlapped with a portion of the third lower liner 360, and the first stress liner 150 may not be in contact with the third lower liner 360.

Furthermore, the third lower liner 360 and the upper liner 180 may each be a silicon nitride film. As illustrated in FIG. 21, the third lower liner 360 and the upper liner 180 may be distinguished, although example embodiments are not limited thereto. That is, because the third lower liner 360 and the upper liner 180 may each include a silicon nitride film so that the third lower liner 360 and the upper liner 180 are not distinguished, the third lower liner 360 and the upper liner 180 may seem as one silicon nitride film.

When the third lower liner 360 and the upper liner 180 may each include a silicon nitride film, and a boundary between the third lower liner 360 and the upper liner 180 is not distinguished, the thickness t1 of the silicon nitride film on the first stress liner 150 is less than a thickness t5 of the silicon nitride film on the field insulating film 105 in the third region III.

Referring to FIG. 22, the semiconductor device according to some example embodiments may further include a first lower liner 160 and a third liner 360.

The first lower liner 160 may be formed in the first region I, and the third lower liner 360 may be formed in the third region III.

The first lower liner 160 may be formed by extending along at least a portion of an outer circumference of the first epitaxial pattern 140. The third lower liner 360 may be formed by extending along the outer circumference of the third epitaxial pattern 340.

The first lower liner 160 and the third lower liner 360 may be formed at a same level. The first lower liner 160 and the third lower liner 360 may be directly connected to each other on the field insulating film 105.

When the third lower liner 360 and the upper liner 180 may each include a silicon nitride film, and a boundary between the third lower liner 360 and the upper liner 180 is not distinguished, the thickness t1 of the silicon nitride film on the first stress liner 150 is less than the thickness t5 of the silicon nitride film on the field insulating film 105 in the third region III.

Referring to FIG. 23, the semiconductor device according to some example embodiments may further include a third stress liner 350.

The first stress liner 150 may be formed in the first region I, and the third stress liner 350 may be formed in the third region III.

The third stress liner 350 may be formed by extending along at least a portion of an outer circumference of the third epitaxial pattern 340.

The third stress liner 350 may be formed between the upper liner 180 and the field insulating film 105. The third stress liner 350 may formed by extending along the upper surface of the field insulating film 105.

The third stress liner 350 may be in contact with the upper liner 180. Further, the third stress liner 350 may be in contact with the third epitaxial pattern 340. The third stress liner 350 may be in contact with the third gate spacer 335, the third epitaxial pattern 340, and the upper liner 180.

Further, the field insulating film 105 in the third region III may be in contact with the third stress liner 350.

The third stress liner 350 may include oxide of a material expanding in volume by the oxidation reaction. The third stress liner 350 may include at least one of silicon oxide, germanium oxide, or aluminum oxide, for example.

Example embodiments will be described below based on assumption that the third stress liner 350 includes a silicon oxide.

On the field insulating film 105, the third stress liner 350 may be directly connected to the first stress liner 150.

The thickness t3 of the first stress liner 150 may be different from a thickness t6 of the third stress liner 350. For example, the thickness t3 of the first stress liner 150 in the first region I as a PMOS formation region may greater than a thickness t6 of the third stress liner 350 in the third region III as an NMOS formation region.

Figure 24:
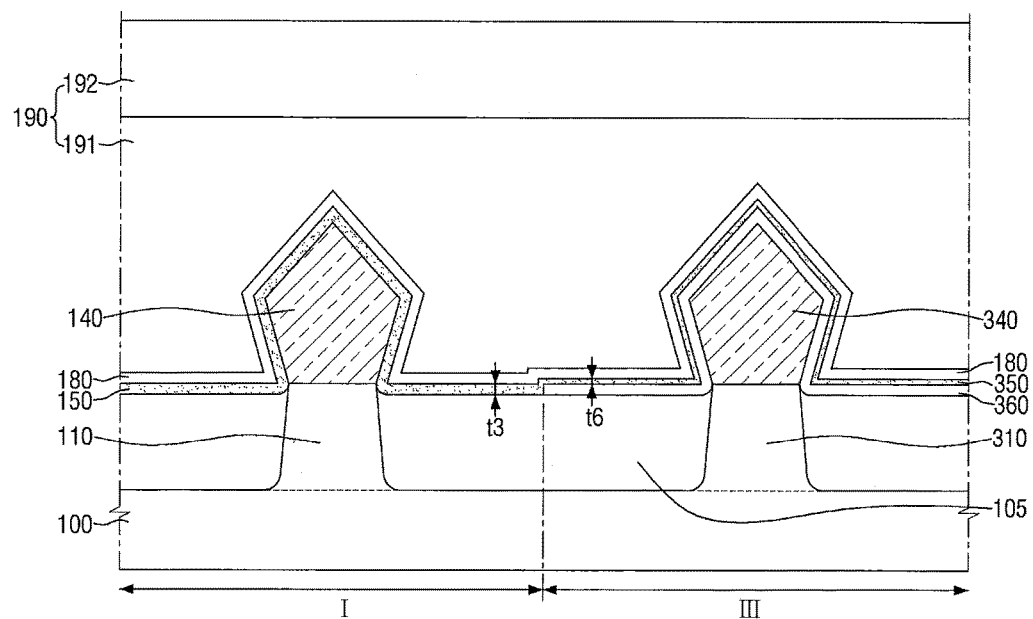
FIG. 24 is a view provided to explain a semiconductor device according to some example embodiments.

FIG. 24 is a view provided to explain a semiconductor device according to some example embodiments. For convenience of explanation, differences that are not explained above with reference to FIG. 23 will be mainly explained below.

Referring to FIG. 24, the semiconductor device according to some example embodiments may further include a third lower liner 360.

The third lower liner 360 may be formed in the third region III, but not in the first region I.

The third lower liner 360 may be formed by extending along at least a portion of an outer circumference of the third epitaxial pattern 340, but the third lower liner 360 does not extend along the outer circumference of the first epitaxial pattern 140.

The third lower liner 360 may be formed between the third stress liner 350 and the field insulating film 105. The third lower liner 360 may be formed by extending along the upper surface of the field insulating film 105.

However, the third lower liner 360 may extend along a portion of the upper surface of the field insulating film 105 located between the first fin-type pattern 110 and the third fin-type pattern 310. That is, of the upper surface of the field insulating film 105, a portion in which third lower liner 360 is formed may be present between the first fin-type pattern 110 and the third fin-type pattern 310.

The third stress liner 350 may be in contact with the third lower liner 360 and the upper liner 180, respectively.

Hereinbelow, a method for fabricating a semiconductor device according to some example embodiments will be described with reference to FIGS. 2A, and 25 to 33.

FIGS. 25 to 33 are views illustrating intermediate stages of fabrication, provided to explain methods for fabricating a semiconductor device according to some example embodiments.

Figure 25:
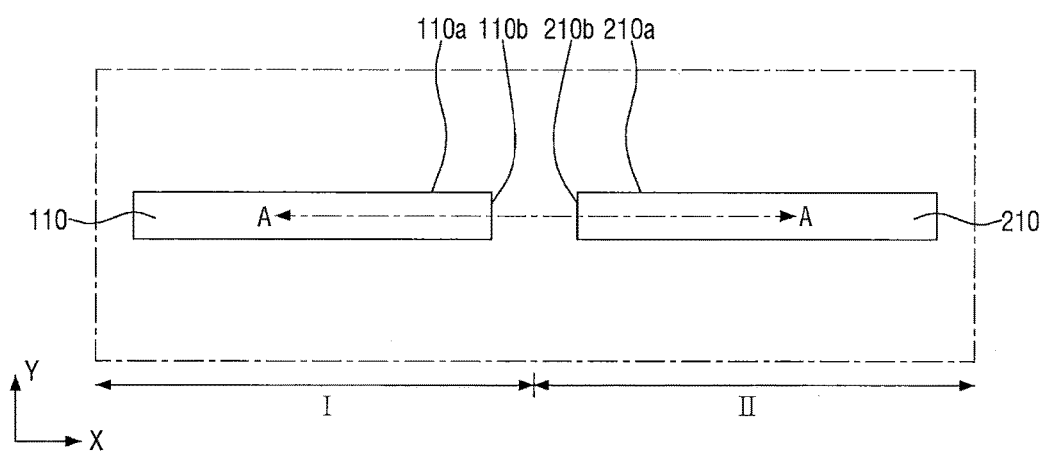
FIGS. 25 to 33 are views illustrating intermediate stages of fabrication, provided to explain a method for fabricating a semiconductor device according to some example embodiments.
Figure 26:
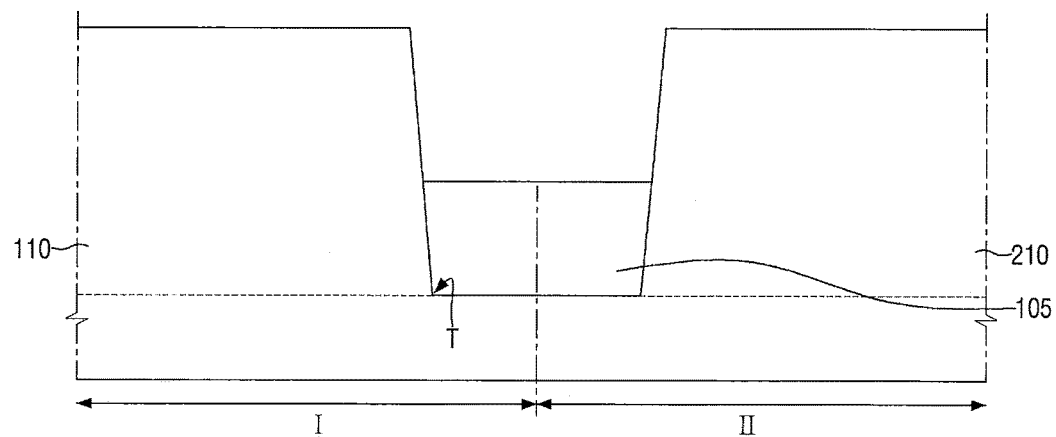

Referring to FIGS. 25 and 26, the first fin-type pattern 110 and the second fin-type pattern 210 elongated in the first direction X are formed on the substrate 100. The first fin-type pattern 110 may be formed in the first region I, and the second fin-type pattern 210 may be formed in the second region II.

The first fin-type pattern 110 and the second fin-type pattern 210 may be longitudinally aligned in the first direction X.

The long side 110a of the first fin-type pattern 110 and the long side 210a of the second fin-type pattern 210 may extend in the first direction X. The short side 110b of the first fin-type pattern 110 and the short side 210b of the second fin-type pattern 210, while extending in the second direction Y, may face each other.

Between the first fin-type pattern 110 and the second fin-type pattern 210, the isolating trench T for isolating the first fin-type pattern 110 from the second fin-type pattern 210 may be formed.

As illustrated, the upper surface of the first fin-type pattern 110 and the upper surface of the second fin-type pattern 210 may be exposed, although example embodiments are not limited thereto. That is, on the upper surface of the first fin-type pattern 110 and the upper surface of the second fin-type pattern 210, the mask pattern used in the process of forming the first fin-type pattern 110 and the second fin-type pattern 210 may remain.

Then, a field insulating film 105, partially covering the first fin-type pattern 110 and the second fin-type pattern 210, may be formed.

The field insulating film 105 may partially fill the isolating trench T formed between the first fin-type pattern 110 and the second fin-type pattern 210.

In the process of forming the field insulating film 105 for partially covering the first fin-type pattern 110 and the second fin-type pattern 210, doping for the purpose of adjusting threshold voltage may be performed on the first fin-type pattern 110 and the second fin-type pattern 210, although example embodiments are not limited thereto.

The following description is based on a cross sectional view taken on line A-A of FIG. 25.

Figure 27:
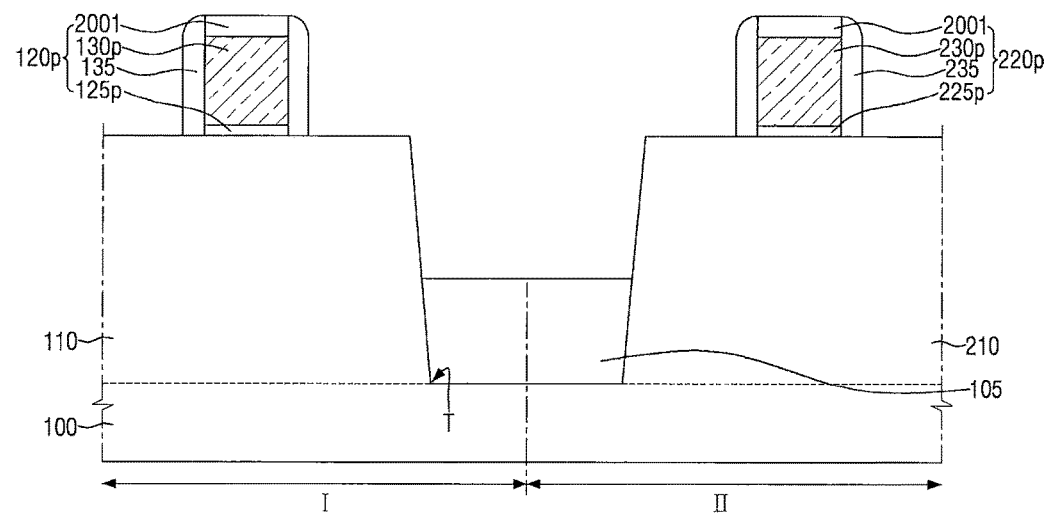

Referring to FIG. 27, on the first fin-type pattern 110, a first dummy gate structure 120p intersecting the first fin-type pattern 110 may be formed. On the second fin-type pattern 210, a second dummy gate structure 220p intersecting the second fin-type pattern 210 may be formed.

The first dummy gate structure 120p may include a first dummy gate insulating film 125p, a first dummy gate electrode 130p, a gate hard mask 2001, and a first gate spacer 135.

The second dummy gate structure 220p may include a second dummy gate insulating film 225p, a second dummy gate electrode 230p, the gate hard mask 2001, and a second gate spacer 235.

The first dummy gate structure 120p and the second dummy gate structure 220p may each be elongated in the second direction Y.

Figure 28:
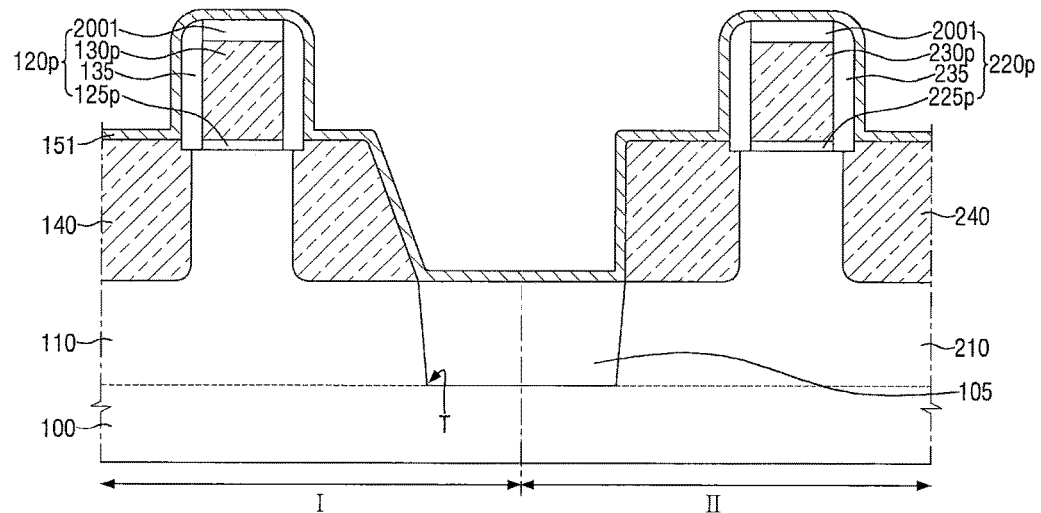

Referring to FIG. 28, on the first fin-type pattern 110, a first epitaxial pattern 140 may be formed on opposite sides of the first dummy gate structure 120p. Further, on the second fin-type pattern 210, a second epitaxial pattern 240 may be formed on opposite sides of the second dummy gate structure 220p.

The first epitaxial pattern 140 and second epitaxial pattern 240 may be formed by different epitaxial processes.

The first epitaxial pattern 140 may include a p-type impurity, and the second epitaxial pattern 240 may include an n-type impurity.

Then, the liner film 151 may be formed along a profile of the first dummy gate structure 120p, a profile of the second dummy gate structure 220p, a profile of the first epitaxial pattern 140, and a profile of the second epitaxial pattern 240.

The liner film 151 may include one of, for example, silicon, silicon germanium, germanium or aluminum. For example, when the liner film 151 includes silicon, the liner film 151 may be referred to as a "silicon liner film".

Further, when the liner film 151 includes silicon, silicon may include one of polysilicon or amorphous silicon.

The liner film 151 may be formed by using, for example, atomic layer deposition (ALD), but not limited thereto.

Figure 29:
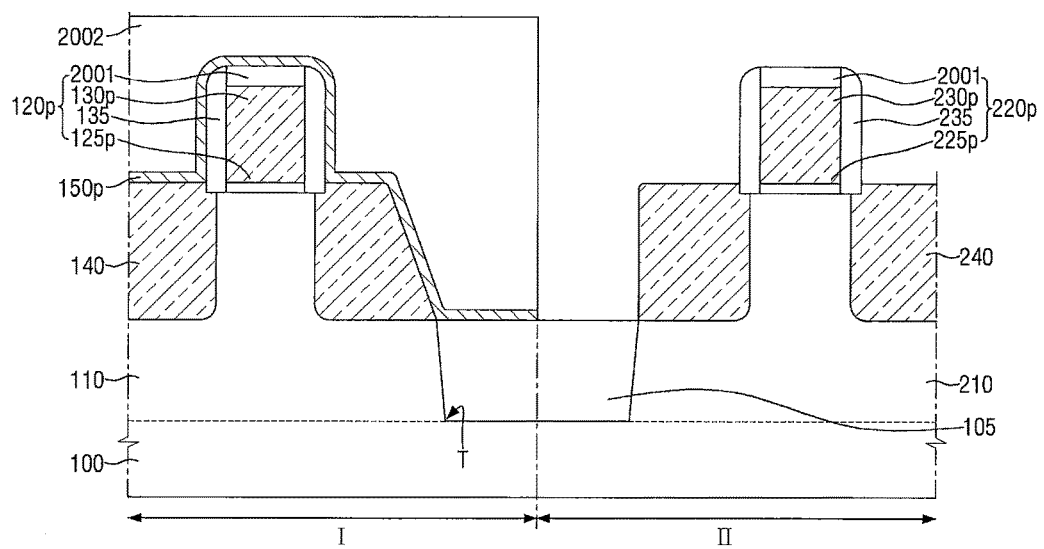

Referring to FIG. 29, a mask pattern 2002 is formed on the substrate 100 in the first region I such that it 2002 covers the liner film 151.

The mask pattern 2002 may expose the liner film 151 formed on the substrate 100 in the second region II.

Then, the liner film 151 in the second region II may be removed by using the mask pattern 2002. As a result, a first pre-stress liner 150p may be formed on the substrate 100 in the first region I.

The first pre-stress liner 150p may be formed along a profile of the first dummy gate structure 120p, a profile of the first epitaxial pattern 140, and a profile of the upper surface of the field insulating film 105.

Figure 30:
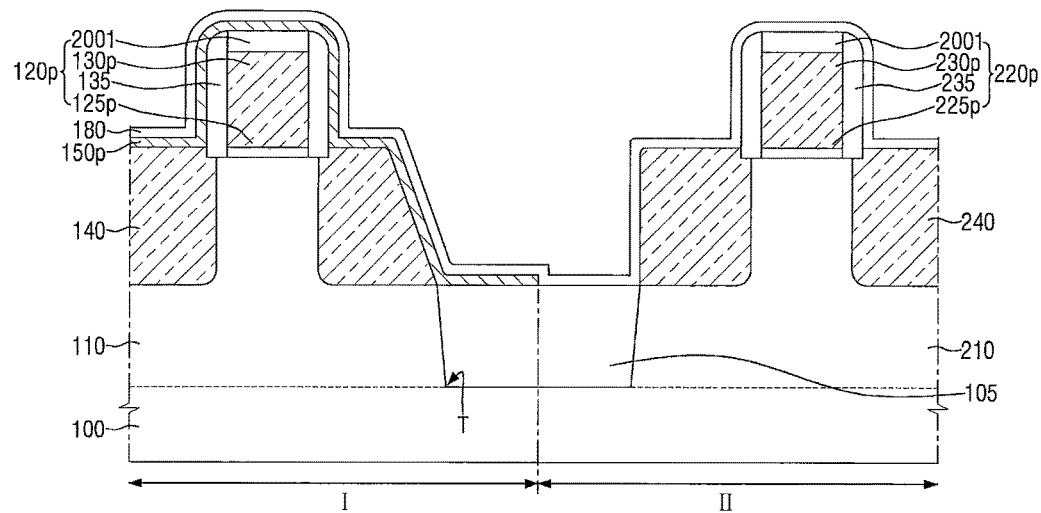

Referring to FIG. 30, the mask pattern 2002 formed in the first region I may be removed.

Then, the upper liner 180 may be formed on the first pre-stress liner 150p.

The upper liner 180 may be formed along a profile of the first dummy gate structure 120p, a profile of the second dummy gate structure 220p, a profile of the first epitaxial pattern 140, and a profile of the second epitaxial pattern 240.

Figure 31:
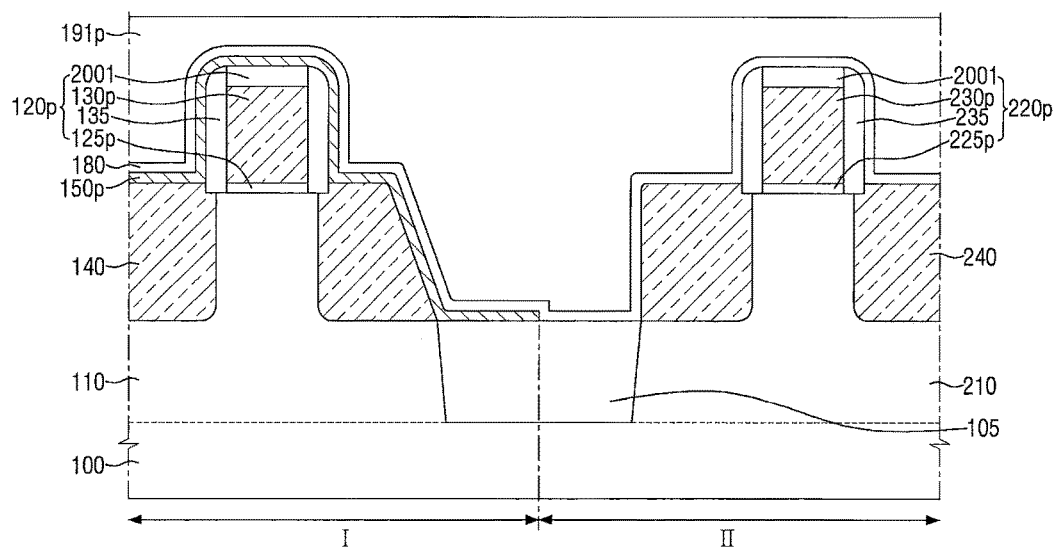

Referring to FIG. 31, a pre-interlayer insulating film 191p may be formed on the upper liner 180.

The pre-interlayer insulating film 191p may span the first region I and the second region II.

Figure 32:
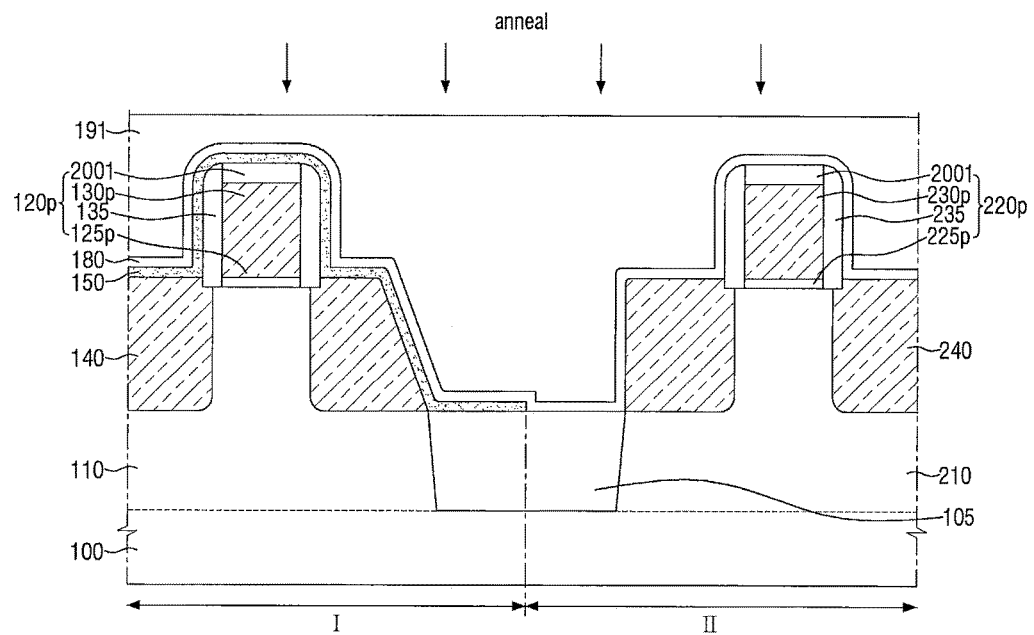

Referring to FIG. 32, a lower interlayer insulating film 191 may be formed on the substrate 100 by annealing the pre-interlayer insulating film 191p.

During annealing of the pre-interlayer insulating film 191p, at least a portion of the first pre-stress liner 150p may be oxidized to form a first stress liner 150. That is, the first stress liner 150 may be formed during forming of the lower interlayer insulating film 191.

As illustrated in FIG. 32, the first pre-stress liner 150p may be entirely oxidized to form the first stress liner 150.

During annealing of the pre-interlayer insulating film 191p, oxygen may be supplied from the pre-interlayer insulating film 191p to the first pre-stress liner 150p. Oxygen supplied to the first pre-stress liner 150p may oxidize the first pre-stress liner 150p.

By oxidization of the first pre-stress liner 150p, a volume of the first stress liner 150 may become greater than a volume of the first pre-stress liner 150p. As a result, the first stress liner 150 may apply the compressive stress to the first epitaxial pattern 140.

Figure 33:
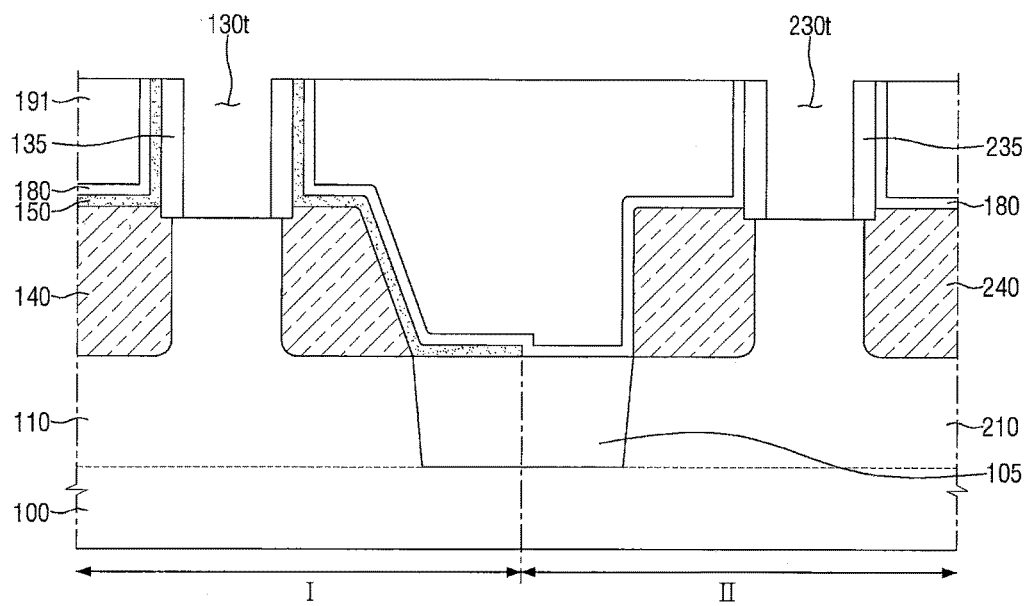

Referring to FIG. 33, the lower interlayer insulating film 191 may be planarized to expose the first dummy gate electrode 130p and the second dummy gate electrode 230p.

At this time, a portion of the first stress liner 150 and a portion of the upper liner 180 may be removed.

Then, by removing the first dummy gate electrode 130p and the first dummy gate insulating film 125p, a first trench 130t exposing a portion of the first fin-type pattern 110 may be formed.

Further, by removing the second dummy gate electrode 230p and the second dummy gate insulating film 225p, a second trench 230t exposing a portion of the second fin-type pattern 210 may be formed.

Then, referring to FIG. 2A, the first gate insulating film 125 and the first gate electrode 130 may be formed within the first trench 130t, and the second gate insulating film 225 and the second gate electrode 230 may be formed within the second trench 130t.

Figure 34:
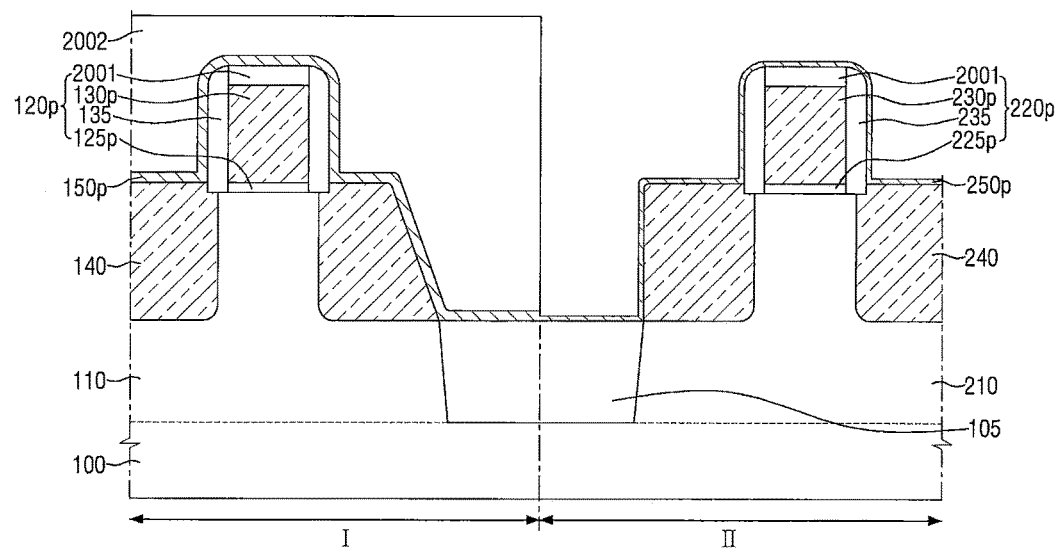
FIGS. 34 and 35 are views illustrating intermediate stages of fabrication, provided to explain a method for fabricating a semiconductor device according to some example embodiments.
Figure 35:
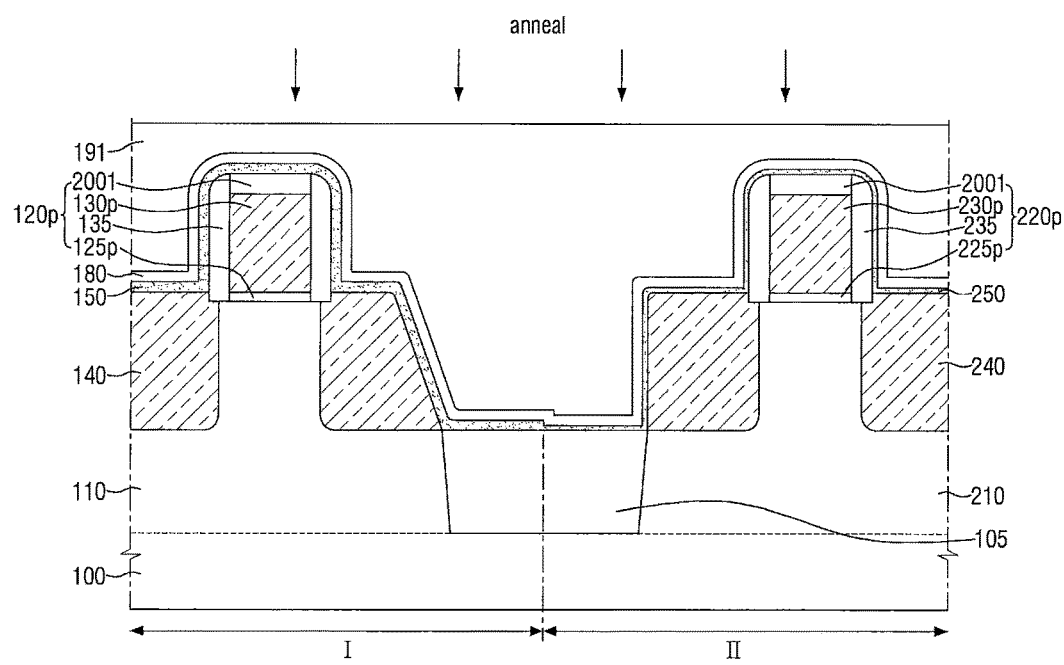

FIGS. 34 and 35 are views illustrating intermediate stages of fabrication, provided to explain methods for fabricating a semiconductor device according to some example embodiments. For reference, FIG. 34 may involve a process performed after FIG. 28.

Referring to FIG. 34, a mask pattern 2002 is formed on the substrate 100 in the first region I such that the mask pattern 2002 covers the liner film 151 in the first region I.

The mask pattern 2002 may expose the liner film 151 formed on the substrate 100 in the second region II.

Then, a portion of the liner film 151 in the second region II may be removed by using the mask pattern 2002. As a result, a first pre-stress liner 150p may be formed on the substrate 100 in the first region I, and the second pre-stress liner 250p may be formed on the substrate 100 in the second region II.

The first pre-stress liner 150p may be formed along a profile of the first dummy gate structure 120p, a profile of the first epitaxial pattern 140, and a profile of the upper surface of the field insulating film 105.

The second pre-stress liner 250p may be formed along a profile of the second dummy gate structure 220p, a profile of the second epitaxial pattern 240, and a profile of the upper surface of the field insulating film 105.

The first pre-stress liner 150p and the second pre-stress liner 250p may be formed simultaneously.

Further, since a portion of the liner film 151 in the second region II is removed to form the second pre-stress liner 250p, a thickness of the first pre-stress liner 150p is greater than a thickness of the second pre-stress liner 250p.

Referring to FIG. 35, the mask pattern 2002 formed in the first region I may be removed.

An upper liner 180 may be formed on the first pre-stress liner 150p and the second pre-stress liner 250p.

Then, as illustrated in FIG. 31, the pre-interlayer insulating film 191p may be formed on the upper liner 180.

Then, a lower interlayer insulating film 191 may be formed on the substrate 100 by annealing the pre-interlayer insulating film 191p.

During annealing of the pre-interlayer insulating film 191p, at least a portion of the first pre-stress liner 150p and at least a portion of the second pre-stress liner 250p may be oxidized to form a first stress liner 150 and a second stress liner 250.

That is, during forming of the lower interlayer insulating film 191, the first stress liner 150 and the second stress liner 250 may be formed simultaneously.

Since a thickness of the first pre-stress liner 150p may be greater than a thickness of the second pre-stress stress liner 250p, the thickness of the first stress liner 150 may be greater than the thickness of the second stress liner 250.

Figure 36:
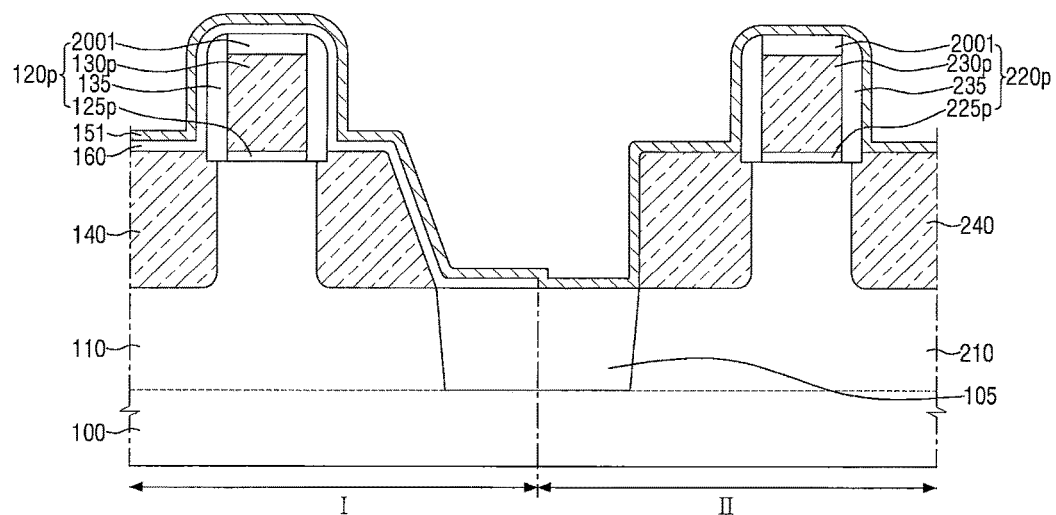
FIG. 36 is a view illustrating intermediate stage of fabrication, provided to explain a method for fabricating a semiconductor device according to some example embodiments.

FIG. 36 is a view illustrating intermediate stage of fabrication, provided to explain methods for fabricating a semiconductor device according to some example embodiments. For reference, FIG. 36 may involve a process performed after FIG. 27.

Referring to FIG. 36, a first epitaxial pattern 140 may be formed on opposite sides of the first dummy gate structure 120p on the first fin-type pattern 110.

Then, a first lower liner 160 may be formed along a profile of the first dummy gate structure 120p and a profile of the first epitaxial pattern 140. No first lower liner 160 may be formed in the second region II.

The second epitaxial pattern 240 may be formed on opposite sides of the second dummy gate structure 220p on the second fin-type pattern 210.

Since the first epitaxial pattern 140 and the second epitaxial pattern 240 may be formed by different epitaxial processes, the first lower liner 160 may be formed before or after forming of the second epitaxial pattern 240.

Then, the liner film 151 may be formed on the first lower liner 160.

Figure 37:
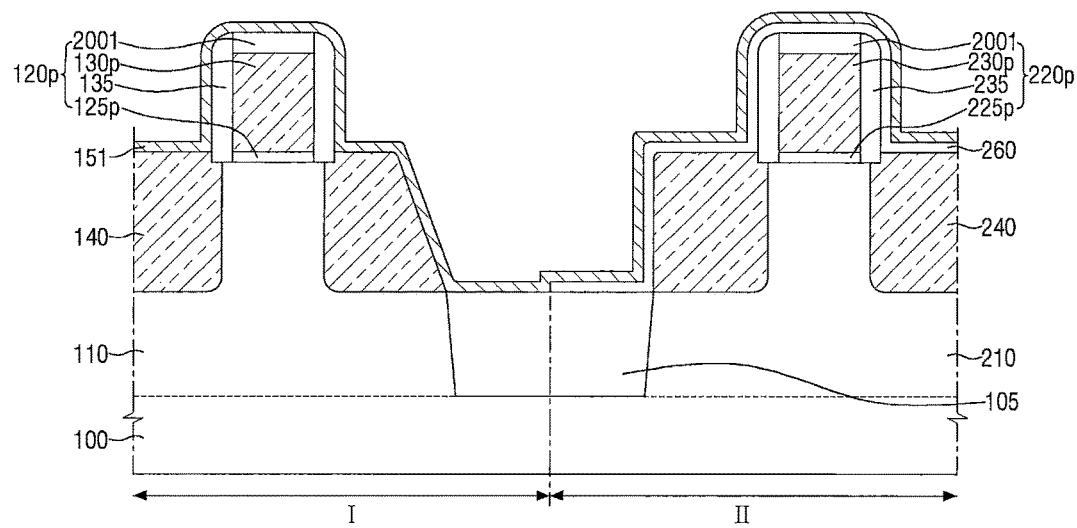
FIG. 37 is a view illustrating intermediate stage of fabrication, provided to explain a method for fabricating a semiconductor device according to some example embodiments.

FIG. 37 is a view illustrating intermediate stage of fabrication, provided to explain methods for fabricating a semiconductor device according to some example embodiments. For reference, FIG. 37 may involve a process performed after FIG. 27.

Referring to FIG. 37, a second epitaxial pattern 240 may be formed on opposite sides of the second dummy gate structure 220p on the second fin-type pattern 210.

Then, a second lower liner 260 may be formed along a profile of the second dummy gate structure 220p and a profile of the second epitaxial pattern 240. No second lower liner 260 may be formed in the first region I.

The first epitaxial pattern 140 may be formed on opposite sides of the first dummy gate structure 120p on first fin-type pattern 110.

Since the first epitaxial pattern 140 and the second epitaxial pattern 240 may be formed by different epitaxial processes, the second lower liner 260 may be formed before or after forming of the first epitaxial pattern 140.

Then, the liner film 151 may be formed on the second lower liner 260.

Figure 38:
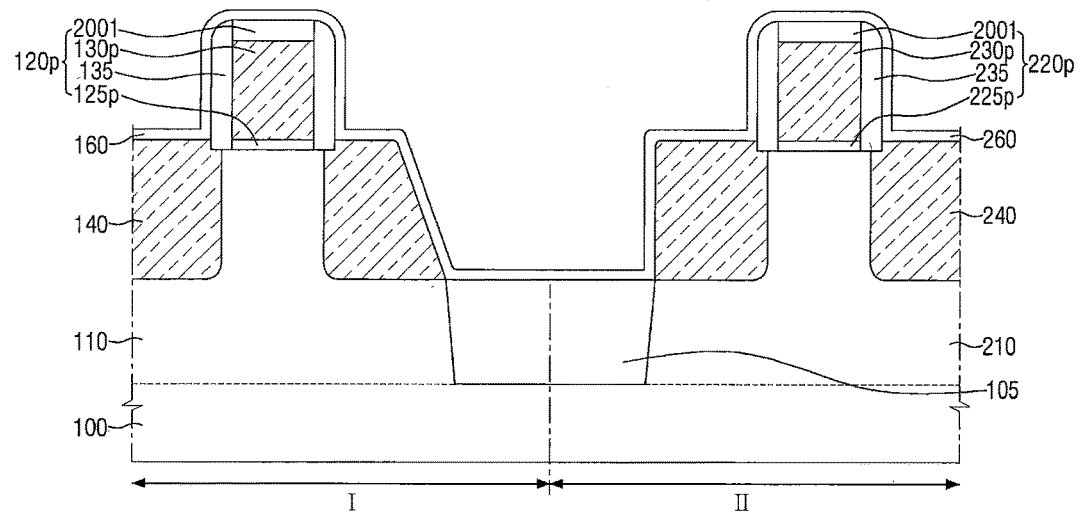
FIG. 38 is a view illustrating intermediate stage of fabrication, provided to explain a method for fabricating a semiconductor device according to some example embodiments.

FIG. 38 is a view illustrating intermediate stage of fabrication, provided to explain methods for fabricating a semiconductor device according to some example embodiments. For reference, FIG. 38 may involve a process performed after FIG. 27.

Referring to FIG. 38, a first epitaxial pattern 140 may be formed on opposite sides of the first dummy gate structure 120p on the first fin-type pattern 110. Further, a second epitaxial pattern 240 may be formed on opposite sides of the second dummy gate structure 220p on the second fin-type pattern 210.

Then, the first lower liner 160 may be formed along a profile of the first dummy gate structure 120p and a profile of the first epitaxial pattern 140. Further, the second lower liner 260 may be formed along a profile of the second dummy gate structure 220p and a profile of the second epitaxial pattern 240.

The first lower liner 160 and the second lower liner 260 may be formed by same fabrication process.

Then, a liner film 151 may be formed on the first lower liner 160 and the second lower liner 260.

Figure 39:
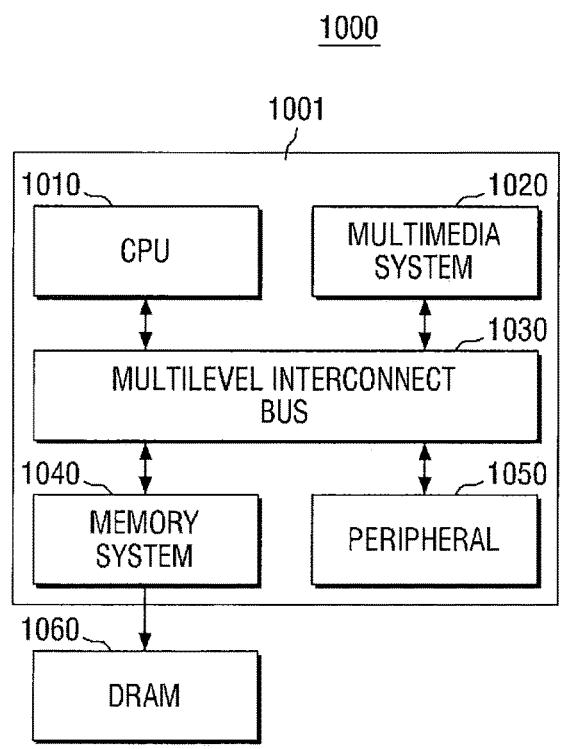
FIG. 39 is a block diagram of a system on a chip (SoC) system including a semiconductor device according to example embodiments.

FIG. 39 is a block diagram of a system on a chip (SoC) system including a semiconductor device according to example embodiments.

Referring to FIG. 39, a SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some example embodiments, the CPU 1010 may be configured on a multi-core environment which includes a plurality of cores.

The multimedia system 1020 may be used for performing a variety of multimedia functions on the SoC system 1000. The multimedia system 1020 may include a 3D engine module, a video codec, a display system, a camera system, a post-processor, or the like.

The bus 1030 may be used for exchanging data communication among the CPU 1010, the multimedia system 1020, the memory system 1040 and the peripheral circuit 1050. In some example embodiments of the present disclosure, the bus 1030 may have a multi-layer structure. Specifically, an example of the bus 1030 may be a multi-layer advanced high-performance bus (AHB), or a multi-layer advanced eXtensible interface (AXI), although example embodiments are not limited herein.

The memory system 1040 may provide environments necessary for the application processor 1001 to connect to an external memory (e.g., DRAM 1060) and perform high-speed operation. In some example embodiments of the present disclosure, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some example embodiments, the DRAM 1060 may be disposed externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the example embodiments explained above.

In concluding the detailed description, those skilled in the art will appreciate that many variations and modifications can be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device, comprising:
a substrate including a first region and a second region;
a first fin-type pattern in the first region;
a second fin-type pattern in the second region;
a first gate structure intersecting the first fin-type pattern on the first fin-type pattern, the first gate structure including a first gate spacer;
a second gate structure intersecting the second fin-type pattern on the second fin-type pattern, the second gate structure including a second gate spacer;
a first epitaxial pattern formed on opposite sides of the first gate structure, on the first fin-type pattern, the first epitaxial pattern having a first impurity;
a second epitaxial pattern formed on opposite sides of the second gate structure, on the second fin-type pattern, the second epitaxial pattern having a second impurity;
a first silicon nitride film extending along a sidewall of the first gate spacer, a sidewall of the second gate spacer, an upper surface of the first epitaxial pattern, and an upper surface of the second epitaxial pattern;
a first silicon oxide film extending along the sidewall of the first gate spacer between the first gate spacer and the first silicon nitride film and extending along the first epitaxial pattern between the upper surface of the first epitaxial pattern and the first silicon nitride film and extending along the first epitaxial pattern between a sidewall of the first epitaxial pattern and the first silicon nitride film; and
a second silicon oxide film extending along the sidewall of the second gate spacer between sidewall of the second gate spacer and the first silicon nitride film,
wherein a thickness of the first silicon oxide film is different from a thickness of the second silicon oxide film.

2. The semiconductor device of claim 1, wherein the first silicon oxide film is in contact with the first gate spacer, the first silicon nitride film and the first epitaxial pattern.

3. The semiconductor device of claim 1, wherein the first silicon oxide film does not extend between the second gate spacer and the first silicon nitride film and between the second epitaxial pattern and the first silicon nitride film.

4. The semiconductor device of claim 1, wherein the first impurity is a p-type impurity, and the second impurity is an n-type impurity, and
the thickness of the first silicon oxide film is greater than the thickness of the second silicon oxide film.

5. The semiconductor device of claim 1, further comprising a field insulating film defining the first fin-type pattern and the second fin-type pattern, on the substrate,
wherein a thickness of the first silicon nitride film on the field insulating film in the second region is greater than a thickness of the first silicon nitride film on the field insulating film in the first region.

6. The semiconductor device of claim 1, further comprising a second silicon nitride film extending along the sidewall of the first gate spacer between the first silicon oxide film and the first gate spacer,
wherein the second region is free of the second silicon nitride film.

7. The semiconductor device of claim 6, wherein the first silicon oxide film is in contact with the first silicon nitride film and the second silicon nitride film.

8. The semiconductor device of claim 1, wherein the first region is a PMOS formation region, and the second region is an NMOS formation region.

9. A semiconductor device, comprising:
a first fin-type pattern in a first region of a substrate;
a second fin-type pattern in a second region of the substrate;
a first gate structure on the first fin-type pattern and including a first gate spacer;
a second gate structure on the second fin-type pattern and including a second gate spacer;
a first epitaxial pattern on opposite sides of the first gate structure and having a first impurity;
a second epitaxial pattern on opposite sides of the second gate structure and having a second impurity;
a first silicon nitride film extending along a sidewall of the first gate spacer, along an upper surface of the first epitaxial pattern and along a sidewall of the first epitaxial pattern; and
a first silicon oxide film extending along a portion of the sidewall of the first gate spacer, along the upper surface of the first epitaxial pattern and along the sidewall of the first epitaxial pattern; and
a second silicon oxide film extending along the sidewall of the second gate spacer between sidewall of the second gate spacer and the first silicon nitride film,
wherein a thickness of the first silicon oxide film is different from a thickness of the second silicon oxide film.

10. The semiconductor device of claim 9, wherein the first silicon oxide film is between the first gate spacer and the first silicon nitride film and between the upper surface of the first epitaxial pattern and the first silicon nitride film and between the sidewall of the first epitaxial pattern and the first silicon nitride film.

11. The semiconductor device of claim 9, wherein there is no silicon oxide film between the second epitaxial pattern and the first silicon nitride film.

12. The semiconductor device of claim 9, further comprising a second silicon nitride film extending along the sidewall of the first gate spacer between the first silicon oxide film and the first gate spacer,
wherein the second region is free of the second silicon nitride film, and
wherein the first silicon oxide film is in contact with the first silicon nitride film and the second silicon nitride film.

13. The semiconductor device of claim 9, wherein the first silicon oxide film is in contact with the first gate spacer and the first silicon nitride film.

14. A semiconductor device, comprising:
a first fin-type pattern in a first region of a substrate;
a second fin-type pattern in a second region of the substrate;
a field insulating film defining the first fin-type pattern and the second fin-type pattern, on the substrate,
a first gate structure on the first fin-type pattern and including a first gate spacer;
a second gate structure on the second fin-type pattern and including a second gate spacer;
a first epitaxial pattern on opposite sides of the first gate structure and having a first impurity;
a second epitaxial pattern on opposite sides of the second gate structure and having a second impurity;
an interlayer insulating film formed between the first epitaxial pattern and second epitaxial pattern;
a first silicon nitride film extending along a sidewall of the first gate spacer; and
a first silicon oxide film extending along a portion of the sidewall of the first gate spacer, extending along a sidewall of the first epitaxial pattern and extending between the field insulating film and the interlayer insulating film, wherein the first silicon nitride film is further formed on a sidewall of the second gate spacer, an upper surface of the first epitaxial pattern, and an upper surface of the second epitaxial pattern, and wherein there is no silicon oxide film between the second gate spacer and the first silicon nitride film and no silicon oxide film between the second epitaxial pattern and the first silicon nitride film.

15. The semiconductor device of claim 14, wherein the first silicon oxide film is between the first gate spacer and the first silicon nitride film.

16. The semiconductor device of claim 14, further comprising a second silicon nitride film extending along the sidewall of the first gate spacer between the first silicon oxide film and the first gate spacer, wherein the second region is free of the second silicon nitride film, and wherein the first silicon oxide film is in contact with the first silicon nitride film and the second silicon nitride film.

17. The semiconductor device of claim 14, wherein the first silicon oxide film is in contact with the first gate spacer and the first silicon nitride film.

18. The semiconductor device of claim 14, wherein the first silicon nitride film extends along an upper surface of the first epitaxial pattern and along a sidewall of the first epitaxial pattern, and wherein the first silicon oxide film extends along the upper surface of the first epitaxial pattern and along the sidewall of the first epitaxial pattern.

* * * * *